United States Patent
Myjak et al.

(10) Patent No.: US 11,152,558 B2
(45) Date of Patent: Oct. 19, 2021

(54) TRANSDUCER DRIVING METHODS AND TRANSDUCER DRIVING SYSTEMS

(71) Applicant: Battelle Memorial Institute, Richland, WA (US)

(72) Inventors: Mitchell J. Myjak, Richland, WA (US); Matthew S. Taubman, Richland, WA (US); Kayte M. Denslow, Richland, WA (US); Calvin G. Anderson, Richland, WA (US)

(73) Assignee: Battelle Memorial Institute, Richland, WA (US)

( * ) Notice: Subject to any disclaimer, the term of this patent is extended or adjusted under 35 U.S.C. 154(b) by 1146 days.

(21) Appl. No.: 15/246,073

(22) Filed: Aug. 24, 2016

(65) Prior Publication Data
US 2017/0063327 A1  Mar. 2, 2017

Related U.S. Application Data

(60) Provisional application No. 62/210,192, filed on Aug. 26, 2015.

(51) Int. Cl.
*H01L 41/04* (2006.01)

(52) U.S. Cl.
CPC .................. *H01L 41/042* (2013.01)

(58) Field of Classification Search
CPC .................................................. H01L 41/042
USPC .......................................................... 310/317
See application file for complete search history.

(56) References Cited

U.S. PATENT DOCUMENTS

| 2006/0006762 A1* | 1/2006 | Matsuzaki | H02N 2/004 310/317 |
| 2007/0001547 A1* | 1/2007 | Sawada | G04C 3/12 310/317 |
| 2015/0042209 A1* | 2/2015 | Wischenwskiy | H02N 2/007 310/323.16 |

OTHER PUBLICATIONS

Dong et al., "A Novel Control System for Automaticaiiy Locking a Diode Laser Frequency to a Selected Gas Absorption Line", Measurement Science and Technology 18, 2007, United Kingdom, pages 1447-1452.

Koch, "Automatic Laser Frequency Locking to Gas Absorption Lines", Optical Engineering vol. 42, Jun. 2003, United States, pp. 1690-1693.

(Continued)

*Primary Examiner* — Derek J Rosenau
(74) *Attorney, Agent, or Firm* — Wells St. John P.S.

(57) ABSTRACT

Transducer driving methods and transducer driving systems are described. According to one aspect, a transducer driving method includes providing a plurality of initial driving signals to a transducer, wherein each of the initial driving signals has a respective one of a plurality of different frequencies, identifying one of the frequencies where the transducer has a reduced impedance as a result of the provision of one of the initial driving signals having the one frequency to the transducer compared with impedances of the transducer resulting from the provision of others of the initial driving signals having others of the frequencies to the transducer, determining that the identified one of the frequencies is not acceptable for driving the transducer, as a result of the determining, identifying another of the frequencies, and driving the transducer using another driving signal having the another frequency.

35 Claims, 18 Drawing Sheets

(56) References Cited

OTHER PUBLICATIONS

Lee et al., "Automatic System to Relock a Laser Frequency to a Fabry-Perot Cavity", Review of Scientific Instruments vol. 76. Article No. 026101, Feb. 2005, United States, 2 pages.
Mortimer et al., "High Power Resonant Tracking Amplifier using Admittance Locking", Ultrasonics vol. 39, 2001, Netherlands, pp. 257-261.

* cited by examiner

TRANSDUCER DRIVING METHODS AND TRANSDUCER DRIVING SYSTEMS

RELATED PATENT DATA

This application claims the benefit of U.S. Provisional Patent Application Ser. No. 62/210,192, filed Aug. 26, 2015, titled "Digital Auto Resonance Acquisition and Tracking System for Piezoelectric Transducers", the disclosure of which is incorporated herein by reference.

STATEMENT AS TO RIGHTS TO INVENTIONS MADE UNDER FEDERALLY-SPONSORED RESEARCH AND DEVELOPMENT

This invention was made with Government support under Contract DE-AC0576RL01830 awarded by the U.S. Department of Energy. The Government has certain rights in the invention.

TECHNICAL FIELD

This disclosure relates to transducer driving methods and transducer driving systems.

BACKGROUND OF THE DISCLOSURE

Excitation using sound waves, or sonication, finds various uses in industry and medicine both as part of sensing transducers, and as an alternative to resistive heating. Applications for the latter range from medical apparatus, to industrial applications in the oil industry including, but not limited to, causing water and sand to precipitate from oil slurry, or the miscification of paraffins within a slurry to prevent plating out on inner pipe surfaces. Such heating applications require significant power transfer through large piezoelectric acoustic excitation elements, such transfer being greatly enhanced by the operation of these elements at the frequency of their electro-mechanical resonance.

Some applications use piezoelectric transducers. Ultimate heating of the piezoelectric transducers, both due to electrical losses within them and as a result of the heating of the pipe to which they are attached and the fluid within it, causes the frequency of this resonance to move, and change in strength and character. Accordingly, a resonance tracking system may be used.

Some conventional solutions in the industry involve locking to a zero crossing of the phase signal. However, these approaches are unsuitable for some applications, for example, when the transducer element is modified, such as being cut in half to allow installation. This modification greatly degrades the phase response near the resonance frequency, and thus prevents effective phase locking.

BRIEF DESCRIPTION OF THE DRAWINGS

Example embodiments of the disclosure are described below with reference to the following accompanying drawings.

DETAILED DESCRIPTION OF THE DISCLOSURE

This disclosure is submitted in furtherance of the constitutional purposes of the U.S. Patent Laws "to promote the progress of science and useful arts" (Article 1, Section 8).

At least some aspects of the disclosure are directed towards methods and apparatus for driving transducers. In some embodiments, a digital system is utilized that identifies the electro-mechanical resonances in a transducer, locks onto a resonance of choice, and maintains the driving system to that resonance to drive the transducer.

These systems enable effective transduction of electrical power into acoustic energy for effective heating or sonication of fluids in some example implementations, including applications where transducers are cut to fit around existing pipes. The technology has many important applications in, for example, the oil industry and medical field. A combination of suitable electronics hardware and advanced real-time signal processing and associated methods are described in some of the illustrative embodiments below.

In some embodiments, the transducer element is a piezoelectric element having a cylindrical shape and the electrical driving signals are applied radially between evaporatively coated silver electrodes on both cylindrical surfaces. At various frequencies, this drive excites certain resonances corresponding to distinct electro-physical modes. Each resonance feature consists of a low-impedance branch, formed by a series pathway through the IEEE standard lumped impedance model (discussed further below with respect to FIG. 2), and a high-impedance branch formed by a parallel pathway, or tank-type circuit in the model.

Figure 1:
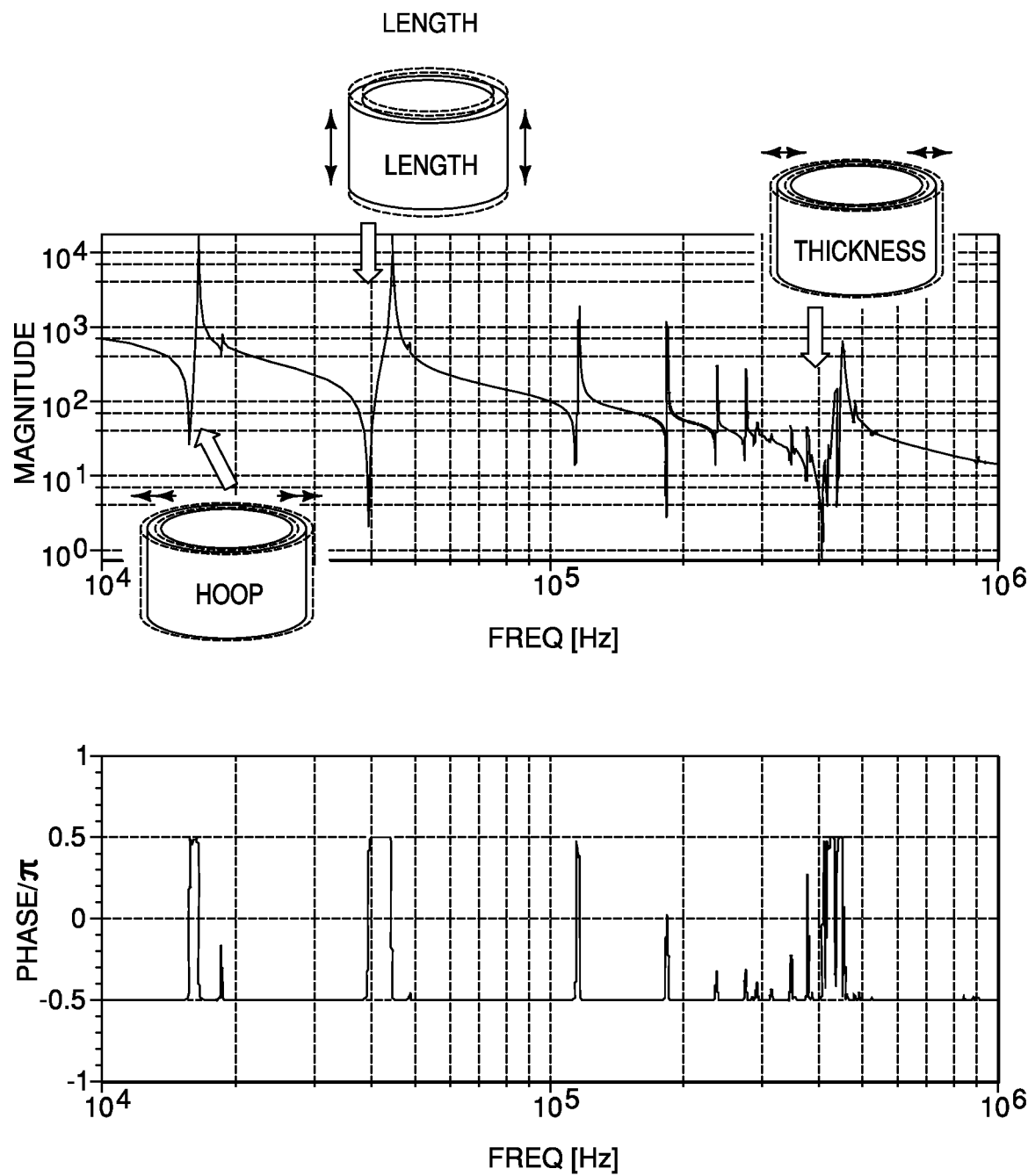
FIG. 1 is a graphical representation of magnitude and phase of an impedance spectrum of a whole cylindrical transducer element.

Referring to FIG. 1, the magnitude and phase of an impedance spectrum of a whole cylindrical piezoelectric transducer, not mounted onto any object, are shown. Three principal modes, corresponding to different physical actions of the cylindrical ring, are distinct in this spectrum. For each of these modes, a primary action of the piezoelectric effect excites the degree of freedom corresponding to the physical mode and there is some level of simultaneous complementary action in other dimensions with the tendency to maintain volume.

The three principal modes are: the hoop mode (e.g., 15.7 kHz); the length mode (e.g., 39.4 kHz); and the thickness mode, (e.g., 405 kHz). For the hoop mode, the whole ring expands and contracts radially; in the length mode, length elongation and contraction is the primary action; finally, in the thickness mode, the wall dimension radially expands and contracts.

As shown in FIG. 1, resonances corresponding to the physical hoop, length and thickness modes are clean and sharp. Phase responses are also clean, with possible exception of thickness mode due to some local complexity. In general, the phase responses have clean rising edges coinciding with the series resonance branches, and falling edges with the parallel branches. Traditionally, phase locking is used to track the drive frequency, typically maintaining zero phase, thus centering the drive frequency on the peak of the resonance.

Figure 2:
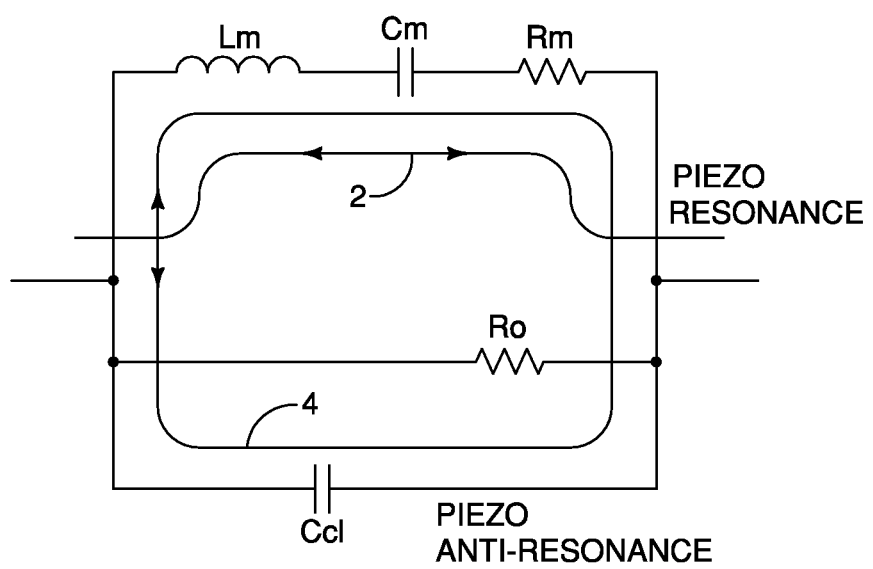
FIG. 2 is a graphical representation of a lumped impedance model of a crystal resonance.

Referring to FIG. 2, a standard IEEE lumped impedance model for a piezo-electric crystal or ceramic is shown. Components labeled with a small 'm' are motional elements which are associated with the physical motion or movement of the transducer. Ccl is the clamping capacitance, typically seen at frequencies lower than that of the lowest frequency resonance. Ro is the dielectric loss of the medium.

Although an approximation, this model allows an operational understanding of the two branches of a typical transducer resonance. For each of these branches, there is a distinct resonant pathway through this lumped model; the lower frequency one is indicated by line and arrows 2, and is a series resonance with a low-valued resistive component, namely, the motional resistance Rm.

The second branch, or resonance, is the parallel, or tank resonance, indicated by line and arrows 4. This has a very high resistance through the ceramic, limited only by the Q of the motional inductance Lm (and other loss mechanisms). This parallel branch is very sensitive to imposed losses in the transducer, or physical disturbance, in the same manner as is any parallel or shunt LC resonant circuit.

Figure 3:
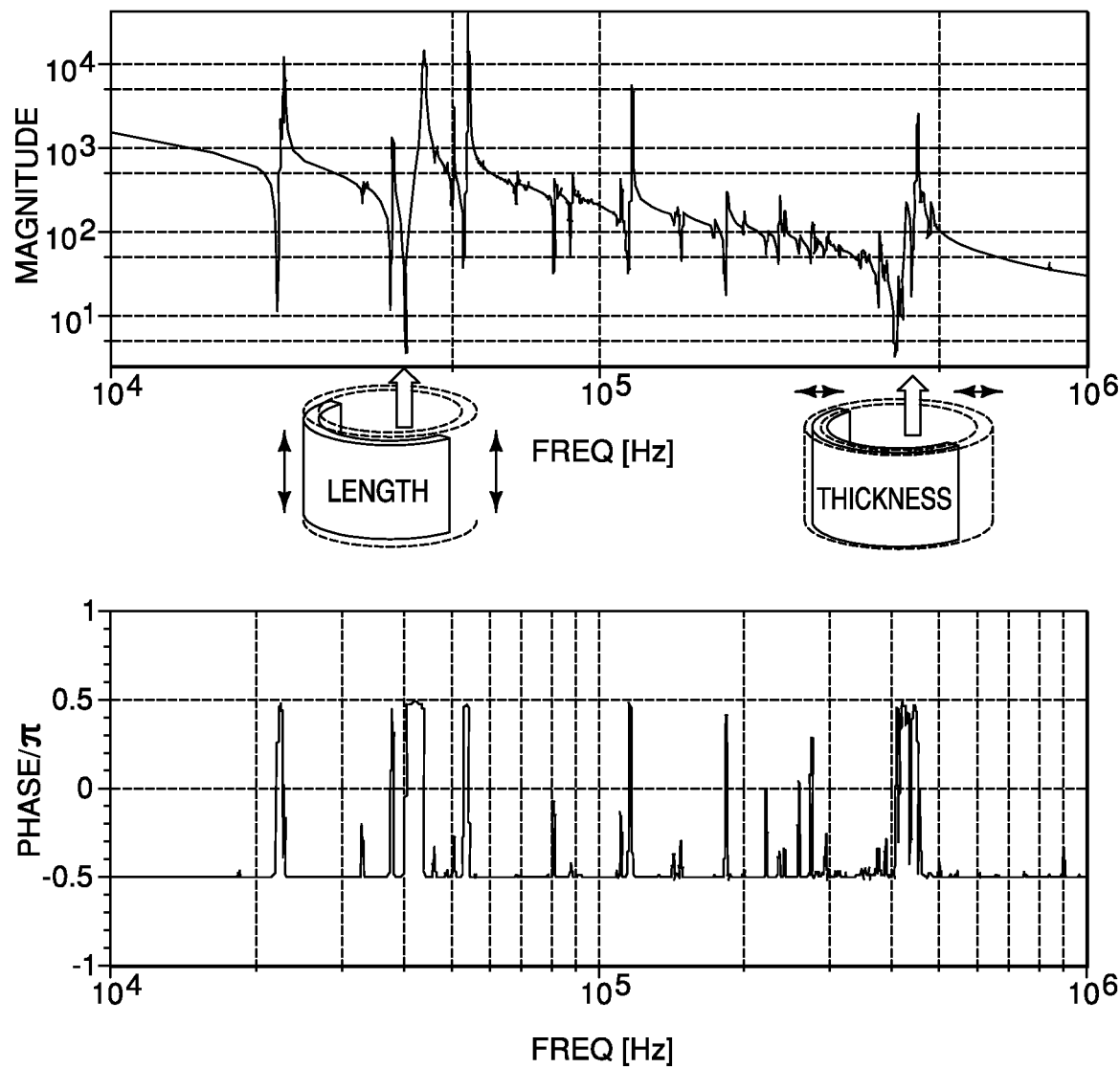
FIG. 3 is a graphical representation of magnitude and phase of an impedance spectrum of a halved cylindrical transducer element.
Figure 4:
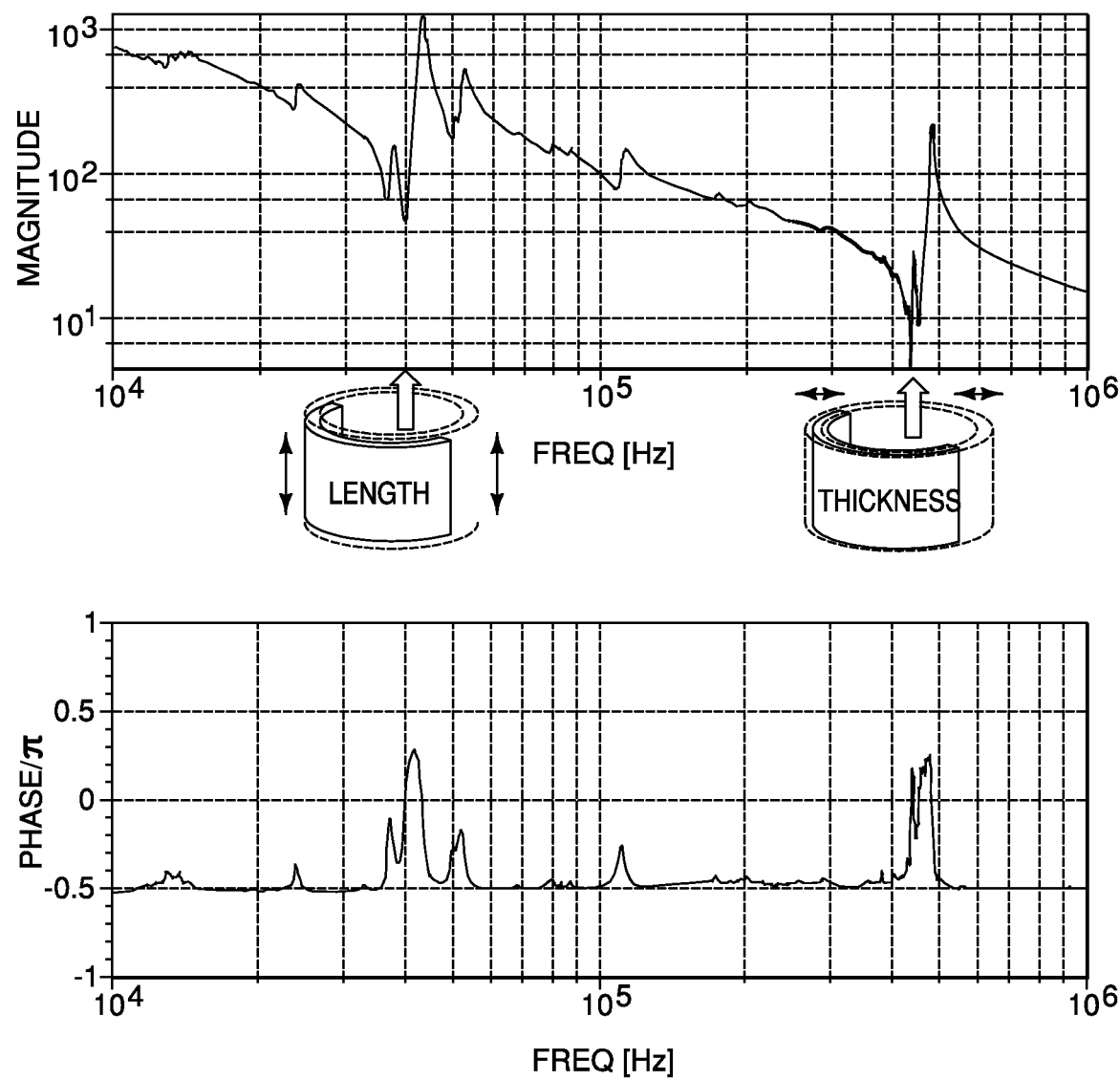
FIG. 4 is a graphical representation of magnitude and phase of a halved cylindrical transducer element mounted to a pipe.

For some applications, a cylindrical piezoelectric transducer may not be the most practical or desirable shape for effective power transduction. In but one example, a cylindrical piezoelectric transducer may be cut in half down the length axis, and then coupled to a pre-existing pipe section which may carry oil, or other fluid or material. The pipe section may be miles below the water in the case of an off-shore oil field installation. Hence, it would be impossible or at least highly impractical to remove or cut into the existing pipe to permit a cylindrical transducer to be installed around its circumference. However, a halved cylindrical transducer coupled to a pipe may have significantly different operational characteristics than the original cylindrical element. For example, the phase response may be sufficiently degraded as to render some phase-locking techniques unfeasible. FIGS. 3-4 progressively illustrate these effects.

Referring to FIG. 3, magnitude and phase of an impedance spectrum of a transducer in the form of a half cylinder sliced down the length is shown. Resonances are still clean and sharp, however, there are additional modes compared to the uncut case of FIG. 1. In particular, the length mode and thickness modes are unchanged in frequency, and still clean. However, the hoop mode is moved up in frequency. Moreover, there are considerably more modes in this spectrum compared to the whole cylinder case.

Referring to FIG. 4, magnitude and phase of an impedance spectrum of a transducer in the form of a half cylinder sliced down the length and mounted to a pipe is shown. Resonances or modes are softened and damped, and the phase response is significantly degraded. Furthermore, the shape of the phase response is highly variable case by case.

In particular, what tends to happen is the high-impedance branches of the resonances can get severely degraded, due to their sensitivity to losses (typical of a parallel LC circuit structure). These variations can be caused by a range of things, including irregularities in mounting symmetries, etc., in particular, cutting and mounting transducer elements to pipes.

At least some embodiments of the disclosure are directed to transducer systems which include a resonance tracking system which automatically locates and captures electro-mechanical resonances of transducers, releases them when they become unsustainable, and reacquires them at a later time. Some embodiments include a digital system that automates the acquisition of resonance in ultrasonic acoustic transducers. Example embodiments are described herein with respect to tracking a desired impedance (e.g., minimum impedance) corresponding to a resonance of the transducer for locking, however, locking may also be based on tracking admittance (e.g., maximum admittance) of the transducer instead of impedance.

The resonance may not necessarily correspond to hoop mode, length mode, or thickness mode, especially for non-cylindrical piezoelectric transducers, but generally represents a frequency that affords greater efficiency of power transduction. In some embodiments, the length mode of the transducer is used, however, resonance tracking systems and methods described herein can also be applied to any electro-physical mode or any resonant mode of any transducer in other embodiments including the hoop mode or thickness mode where the coupling frequencies and impedances are different.

Figure 5:
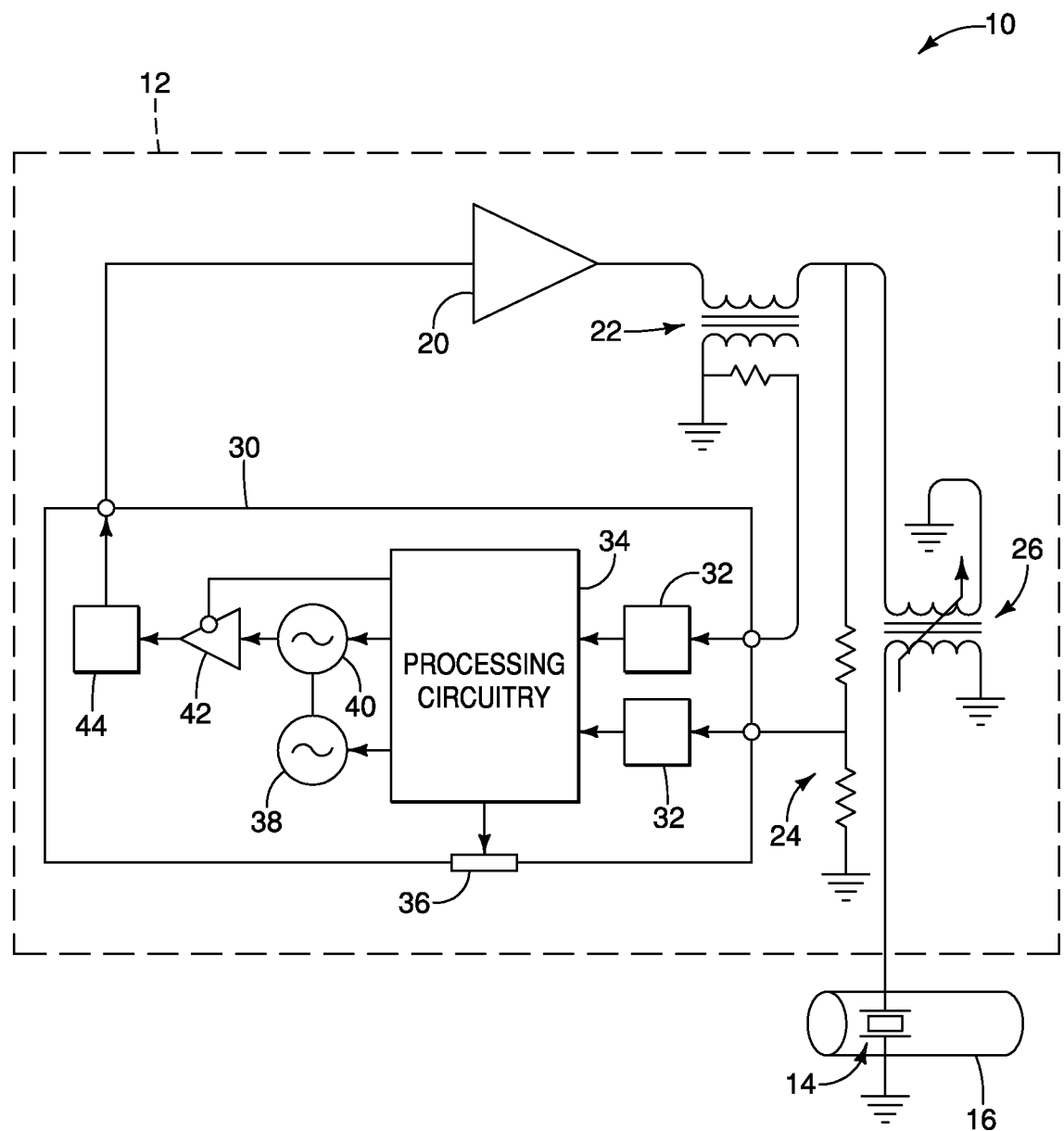
FIG. 5 is an illustrative representation of a transducer system according to one embodiment.

Referring to FIG. 5, a transducer system 10 is shown according to one example embodiment of the disclosure. The illustrated system 10 includes a driving system 12 and a transducer 14, such as a piezoelectric transducer. Driving system 12 provides driving signals to a crystal element (e.g., quartz or ceramic) of the transducer 14 and the crystal transducer element vibrates at the frequencies of the driving signals and which may also be referred to as drive frequencies. The transducer 14 is configured to impart vibrations to an industrial pipe 16 in one example implementation of use of transducer system 10.

As described in detail below, driving system 12 is configured track and lock to different frequencies at different moments in time which result in a minimum impedance of resonance of transducer 14 during the application of the driving signals to the transducer 14 and which corresponds to the resonant frequency of the transducer. In one embodiment, the driving system 12 varies the frequency of the driving signal which is applied to the transducer 14 at different moments in time since the frequency which results in minimum impedance of the transducer 14 also changes over time, for example, as material moves through the pipe 16 to which the transducer 14 is affixed in one embodiment.

In the illustrated embodiment, driving system 12 includes a power amplifier 20, a current sensing transformer 22, a voltage divider 24, and an impedance matching transformer 26. Other embodiments including additional and/or alternative components or circuits are possible.

Power amplifier 20 generates driving signals which are used to drive transducer 14. In one embodiment, power amplifier 20 is a constant gain amplifier. Current sensing transformer 22 receives the driving signals and generates a voltage signal which is indicative of currents of the driving signals applied to and flowing through the transducer 14.

Voltage divider 24 generates a voltage signal which is indicative of the voltages of the driving signals applied across the transducer 14.

An impedance matching transformer 26 converts the driving signals into a form that is suitable to actuate the transducer 14. More specifically, transformer 26 transforms the drive voltage and current from amplifier 20 (e.g., amplifier may be a 50-ohm amplifier) received at the primary of transformer 26 to voltages and currents corresponding to the impedance observed at the physical resonance (e.g., length mode) of the transducer 14. For example, if that impedance is 12.5 ohms, then the impedance matching transformer 26 will be a voltage step-down transformer with a voltage ratio of 2 which yields half the primary voltage at the secondary. The current transformation is the reverse with the current capacity of the secondary being twice that of the primary. The combined effect of half the voltage but double the current capacity yields one quarter of the effective impedance, or 12.5 ohms at the secondary from a 50-ohm source driving the primary. In some embodiments, transformer 26 has multiple taps, which can be selected to provide many different voltage ratios, and thus impedance transformations.

The example depicted driving system 12 also includes a digital board 30 which includes input conditioners 32, processing circuitry 34, an external communications interface 36, a clock 38, a programmable waveform generator 40, a variable gain amplifier 42, and an output conditioner 44. Other embodiments of driving system 12 are possible including more, less and/or alternative components.

The input conditioners 32 are configured to implement voltage level shifting and clipping of the received voltage signals which are indicative of the current and voltage of the driving signals applied to the transducer 14 in the illustrated embodiment.

Processing circuitry 34 is arranged to implement analog-to-digital conversion operations, process data, control data access and storage, issue commands, and control other desired operations. Processing circuitry 34 may comprise circuitry configured to implement desired programming provided by appropriate computer-readable storage media in at least one embodiment. For example, the processing circuitry 34 may be implemented as one or more processor(s) and/or other structure configured to execute executable instructions including, for example, software and/or firmware instructions. Other example embodiments of processing circuitry 34 include hardware logic, PGA, FPGA, ASIC, state machines, and/or other structures, alone or in combination with one or more processor(s). These examples of processing circuitry 34 are for illustration and other configurations are possible.

The processing circuitry 34 may also include storage circuitry which is configured to store programming such as executable code or instructions (e.g., software and/or firmware), electronic data, databases, or other digital information and may include computer-readable storage media. At least some embodiments or aspects described herein may be implemented using programming stored within one or more computer-readable storage medium of the storage circuitry and which is configured to control appropriate processing circuitry 34. The storage circuitry may be external of the processing circuitry 34 in some arrangements.

The computer-readable storage medium may be embodied in one or more articles of manufacture which can contain, store, or maintain programming, data and/or digital information for use by or in connection with an instruction execution system including processing circuitry 34 in one embodiment. For example, computer-readable storage media may be non-transitory and include any one of physical media such as electronic, magnetic, optical, electromagnetic, infrared or semiconductor media. Some more specific examples of computer-readable storage media include, but are not limited to, a portable magnetic computer diskette, such as a floppy diskette, a zip disk, a hard drive, random access memory, read only memory, flash memory, cache memory, and/or other configurations capable of storing programming, data, or other digital information.

Communications interface 36 is arranged to implement communications of driving system 12 with respect to external devices (not shown). For example, communications interface 36 may be arranged to communicate information bi-directionally with respect to driving system 12. Communications interface 36 may be implemented as a serial or parallel connection, USB port, Ethernet interface, Firewire interface, memory card interface, or any other suitable arrangement for implementing communications with respect to driving system 12.

Clock 38 outputs a common clock signal (e.g., 25 MHz) which is applied to processing circuitry 34 and programmable waveform generator 40 to avoid clock drift between the two components in the illustrated embodiment. Processing circuitry 34 controls the programmable waveform generator 40 with high precision to output sinusoidal reference signals of desired frequencies for driving the transducer 14 in one embodiment. For example, as described herein, driving system 12 may perform frequency sweep operations within a desired frequency range to lock to minimum impedance of resonance of transducer 14 in one embodiment. Processing circuitry 34 also controls the amplitude of signals generated by variable gain amplifier 42. The output of amplifier is provided to output conditioner 44 which implements low pass filtering to reject quantization noise from programmable waveform generator 40 as well as implement voltage level shifting. The output of output conditioner 44 is applied to power amplifier 20 to generate the driving signals which are applied to transducer 14.

The transducer system 10 may also include a user interface (not shown) such as a graphical user interface which is configured to interact with a user including conveying data such as operational status and alarms to a user (e.g., displaying visual images for observation by the user) as well as receiving inputs from the user.

Figure 6:
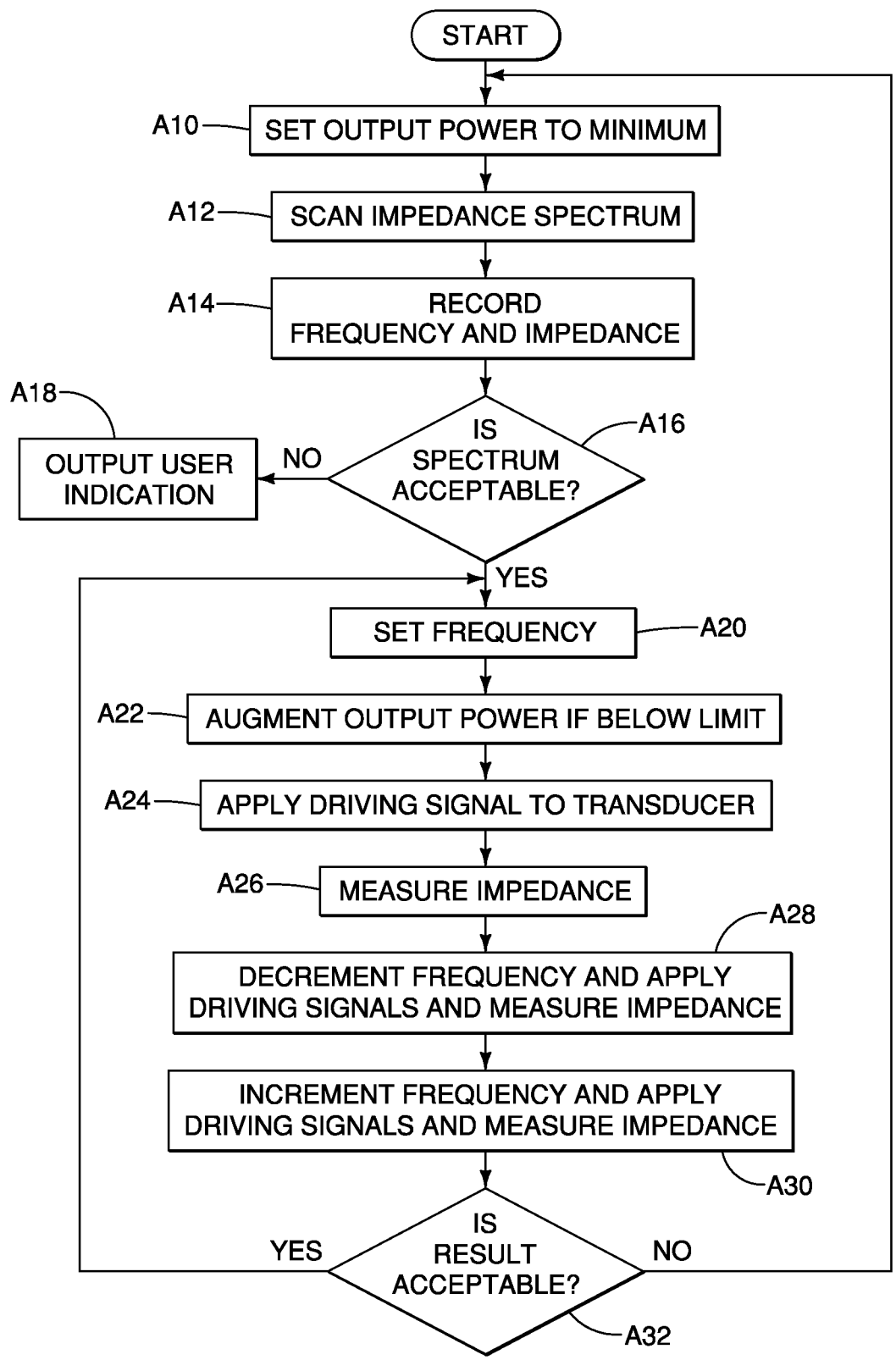
FIG. 6 is a flow chart of a method for driving a transducer according to one embodiment.

Referring to FIG. 6, a method of driving transducer 14 is shown according to one embodiment. The illustrated method locks to a minimum impedance of resonance of transducer 14 and at least some of the acts of the illustrated method may be controlled by processing circuitry 34 in one embodiment. Other methods for driving the transducer including more, less and/or alternative acts may be performed in other embodiments.

At an act A10, the variable amplifier of the driving system is controlled to initially output signals at a minimum power level.

At an act A12, the programmable waveform generator is controlled to scan an impedance spectrum of the transducer across a predefined frequency range. For example, in one embodiment, a driving signal having a lowest frequency within the desired range is generated and applied to the transducer, and the signals indicative of current and voltage applied to the transducer are measured and used to calculate the impedance of the transducer at the frequency of the driving signal. The resulting impedance value for the given frequency is stored.

In some example embodiments, a plurality of digital samples of the signals corresponding to currents through the transducer and voltages across the transducer are generated and used to calculate the impedance of the transducer. Additional details regarding the determination of the impedance are described below.

Thereafter, the programmable waveform generator outputs additional signals having other frequencies within the desired frequency range to be scanned and the impedance of the transducer is calculated and stored for each signal used to drive the transducer. In one embodiment, the processing circuitry controls the programmable waveform generator to increase the frequency of the driving signals which are applied to the transducer until the maximum frequency within the appropriate range is applied to the transducer and the impedance of the transducer is calculated for each of the applied driving signals.

Different frequency ranges may be used for driving different transducers. In but one example, a frequency range of 20 to 100 kHz may be utilized to scan the impedance spectrum of a piezoelectric ceramic transducer element using 1,024 different frequencies.

At an act A14, the frequency within the frequency range which resulted in the transducer having a minimum impedance of resonance is selected or identified and the identified frequency and impedance value are stored.

In one embodiment, criteria which are defined before the initial driving signals are applied to the transducer may be used to select the frequency. One example of predefined criteria which may be utilized to select the frequency includes always selecting the smaller of two relatively close frequencies of resonance. Different and/or additional predefined criteria may be used in different embodiments.

At an act A16, it is determined if the impedance spectrum is acceptable. In one embodiment, predefined criteria which is defined before the driving signals are applied to the transducer may be used to determine if the impedance spectrum is acceptable. For example, it may be determined if the frequency of resonance of the transducer corresponding to the minimum impedance identified in act A14 is within an expected range of frequencies and reasonably close to an expected frequency. Other criteria to determine whether the impedance spectrum is acceptable may be used in other embodiments.

If the result of act A16 is negative, this may indicate that the transducer is defective and the method proceeds to an act A18 where the process ends and an user indication, such as an alarm, may be generated and outputted to the user, for example using the user interface. The ending of the process as the result of a the detection of an unacceptable spectrum may avoid damage to the transducer which may otherwise occur if driving signals of increased power were subsequently applied to the transducer.

If the result of act A16 is affirmative, the process proceeds to an act A20 where the driving system selects the frequency which was recorded in act A14 to be used for the subsequent generation of driving signals.

At an act A22, the power of the driving signal is increased compared with the power of the previously generated driving signals if the power of such previously generated driving signals is below an upper limit. Accordingly, the amplitudes of the driving signals applied to the transducer may be gradually increased over time to a maximum operational level as the method of FIG. 6 is continuously executed during operation of the transducer system.

At an act A24, the driving signal is applied to the transducer.

At an act A26, the impedance of resonance of the transducer is measured and recorded as Z which resulted from the application of the driving signal at act A24.

At an act A28, a plurality of additional driving signals are applied at frequencies which are decremented compared with the frequency of the driving signal which was applied at act A24. The frequency of the applied signals may be continued to be decremented until the impedance is consistently higher than the value of Z recorded in act A26. The frequency of the driving signal applied in acts A24 and A28 which resulted in a minimum measured impedance is recorded along with the corresponding minimum impedance value.

At an act A30, a plurality of driving signals are applied at frequencies which are incremented compared with the frequency of the driving signal which was applied at act A24. The frequency of the applied signals may be continued to be incremented until the impedance is consistently higher than the value of Z recorded in act A26. The frequency of the driving signal applied in acts A24 and A30 which resulted in a minimum measured impedance is recorded along with the corresponding minimum impedance value.

A predefined amount of adjustment from the frequency identified in act A14 may be utilized to implement the frequency decrementing and incrementing of acts A28 and A30 in one embodiment.

The driving signals which are applied to the transducer before act A16 may be referred to as initial driving signals and the driving signals which are applied to the transducer after act A16 may be referred to as additional or subsequent driving signals. The identification of the frequency where the transducer has a minimum impedance of resonance in act A14 using the initial driving signals within the corresponding initial frequency range of the scanned spectrum may be considered to select the frequencies of the additional driving signals in a subsequent frequency range which includes the decremented and incremented frequencies of acts A28 and A30. The second frequency range is substantially smaller than the initial frequency range in some embodiments. In addition, the second frequency range may be considered to be centered about the frequency identified in act A14 since the frequencies of subsequent driving signals applied to the transducer are decremented and incremented from the identified frequency.

At an act A32, it is determined if the driving signal used in acts A14, A28 and A30 which resulted in the minimum impedance of resonance of the transducer is acceptable. For example, the frequency of resonance of the transducer corresponding to the minimum impedance is identified as being acceptable according to predefined criteria, such as whether the identified frequency is within an expected range of frequencies and reasonably close to an expected frequency. In another example, the amplitude and phase of the impedance may be compared with predefined criteria of the transducer being used to determine if the driving signal is acceptable.

In particular, amplitudes of impedance above a certain threshold may indicate a problem with the transducer itself and the application of driving signals to the transducer may be ceased to reduce chances of damage to the transducer if driving signals (including increased power) were thereafter applied to the transducer. Accordingly, at least aspects described herein assist with identification of problems with transducers in the field, for example which may be miles below the water in one example off-shore oil field installation.

Accordingly, as discussed herein according to some embodiments, predefined criteria may be used at acts A14, A16, and A32 to determine whether the driving signals which were applied to the transducer and the response of the transducer itself are acceptable to reduce the chances of the transducer being damaged. In some embodiments, an alarm or other notification may be provided to operators or other users of the transducer system if the spectrum and/or identified frequency corresponding to the minimum impedance of resonance are identified as being not acceptable. In some embodiments, additional driving signals having different frequencies may be identified and utilized to drive the transducer if one or more previous driving signal are found to be unacceptable.

If the result of act A32 is affirmative, the method proceeds to an act A20 where the driving system selects the frequency of the next driving signal to have the frequency determined in acts A14, A28 and A30 which resulted in the transducer having a minimum impedance. In addition, the power of the driving signal may be increased at act A22, and the driving signal may be applied to the transducer in another execution of act A24. Thereafter, the acts A28, A30 and A32 are repeated.

If the result of act A32 is negative, the identified frequency is not utilized and the method returns to act A10 for a subsequent execution of the depicted method including re-scanning the impedance spectrum of the transducer.

Referring to FIGS. 7a-7i, a plurality of circuits of the digital board mentioned above are shown according to one embodiment. Other circuitry may be used in other embodiments.

Figure 7A:
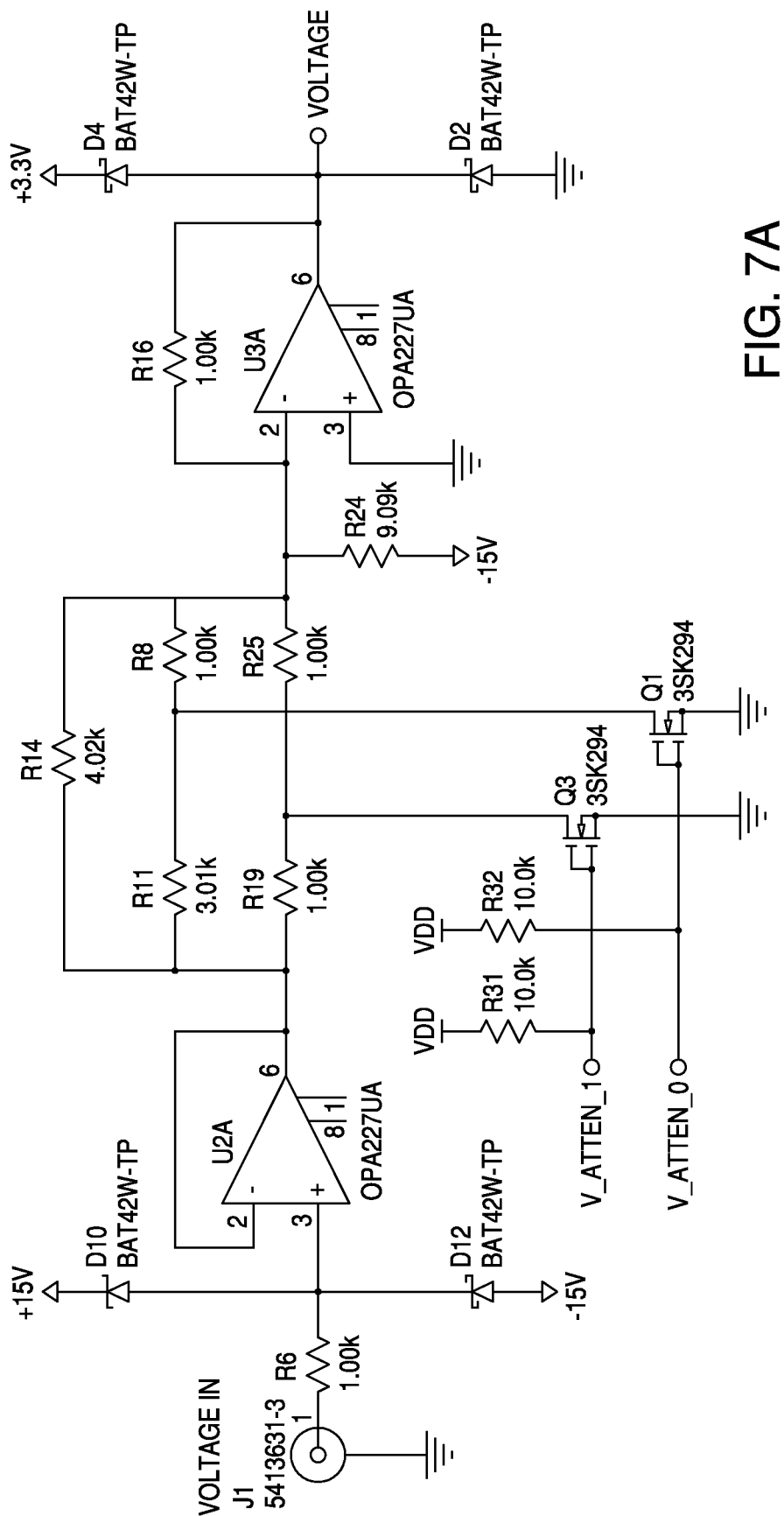
FIGS. 7*a-i* are circuit schematic diagrams of various circuits of a transducer system according to one embodiment.

FIG. 7a is an example circuit of the input conditioning circuit 32 which is coupled with voltage divider 24.

Figure 7B:
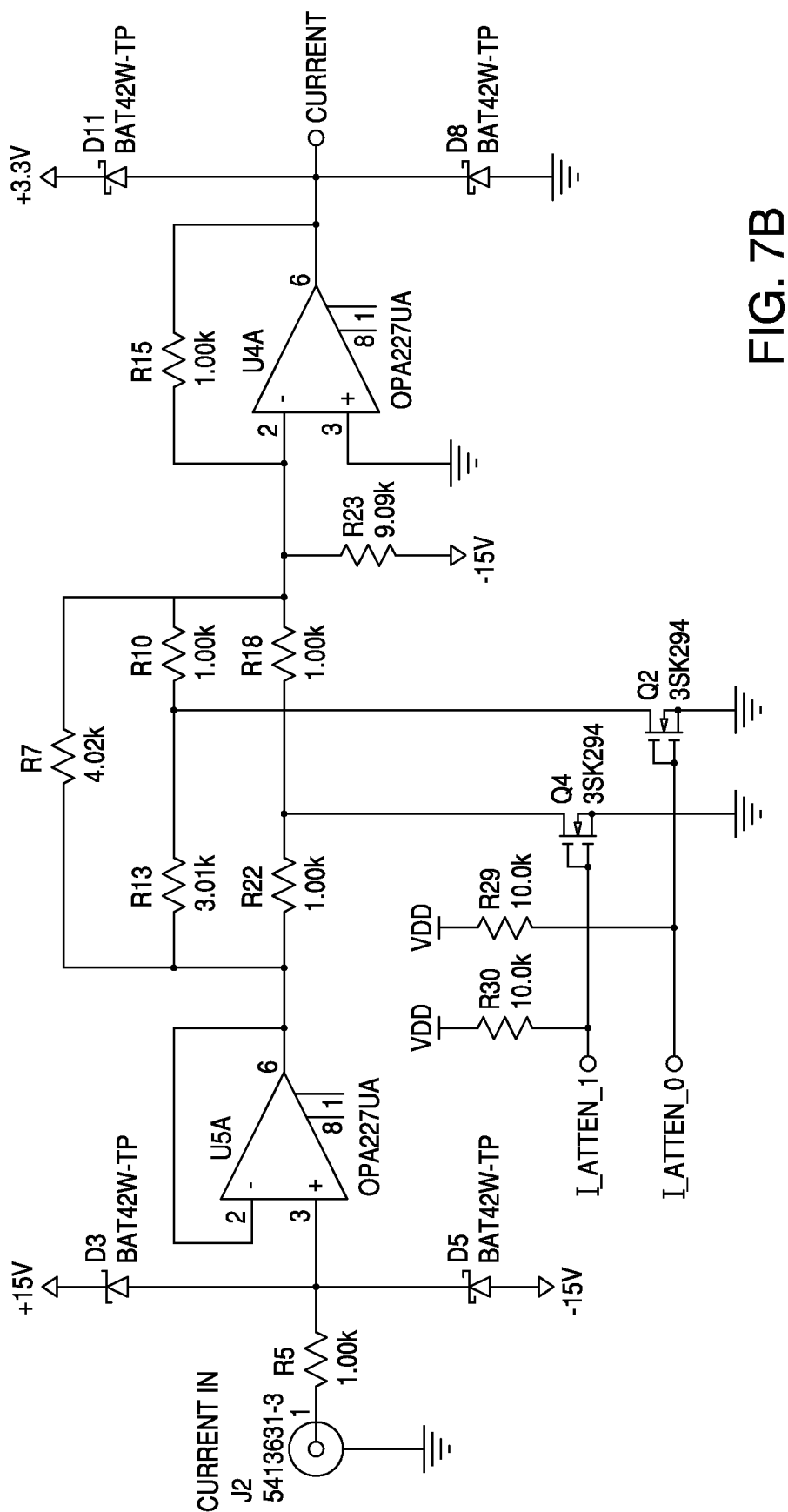

FIG. 7b is an example circuit of the input conditioning circuit 32 which is coupled with current sensing transformer 22.

Figure 7C:
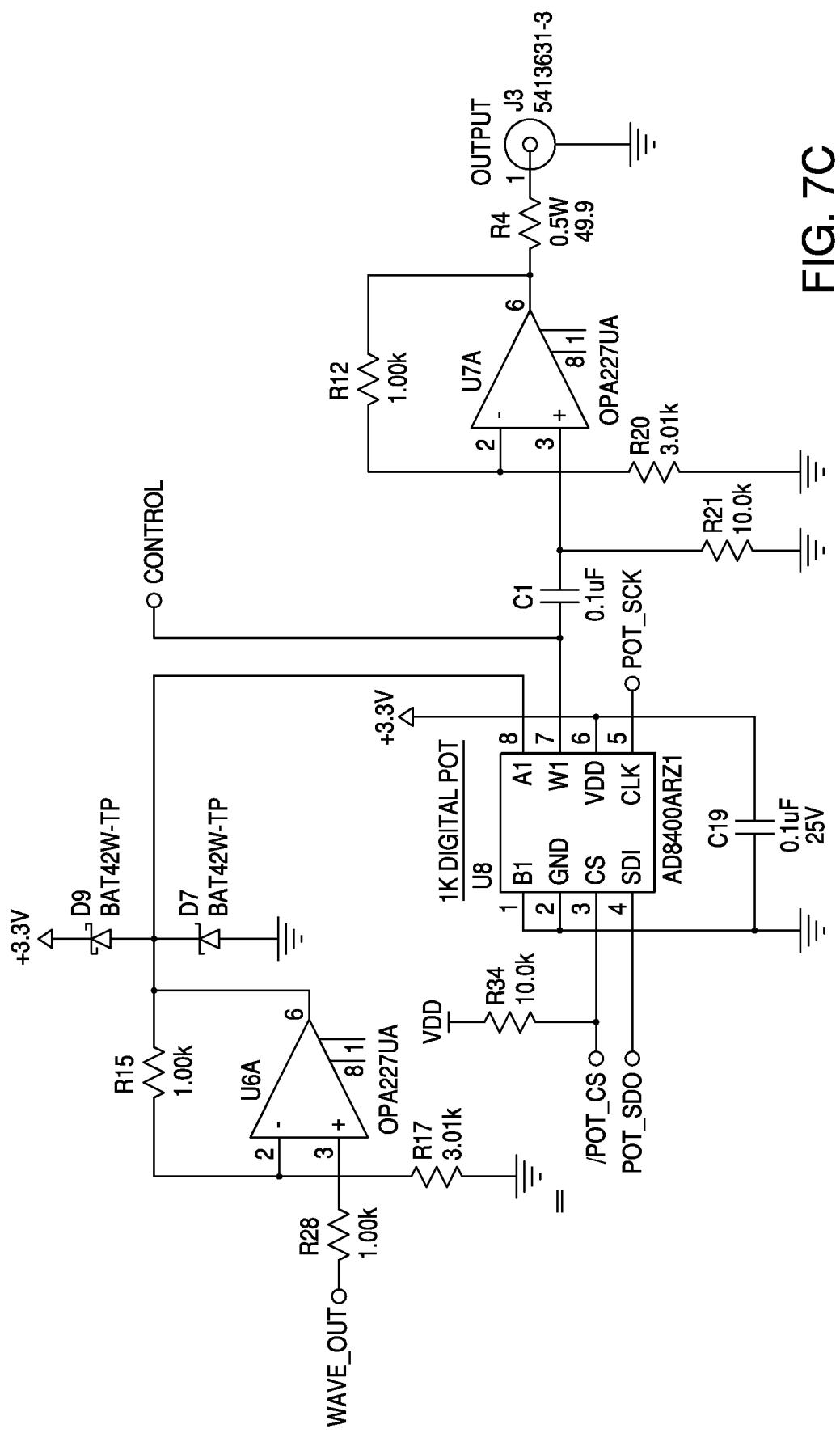

FIG. 7c is an example circuit of the output conditioning circuit 44.

Figure 7D:
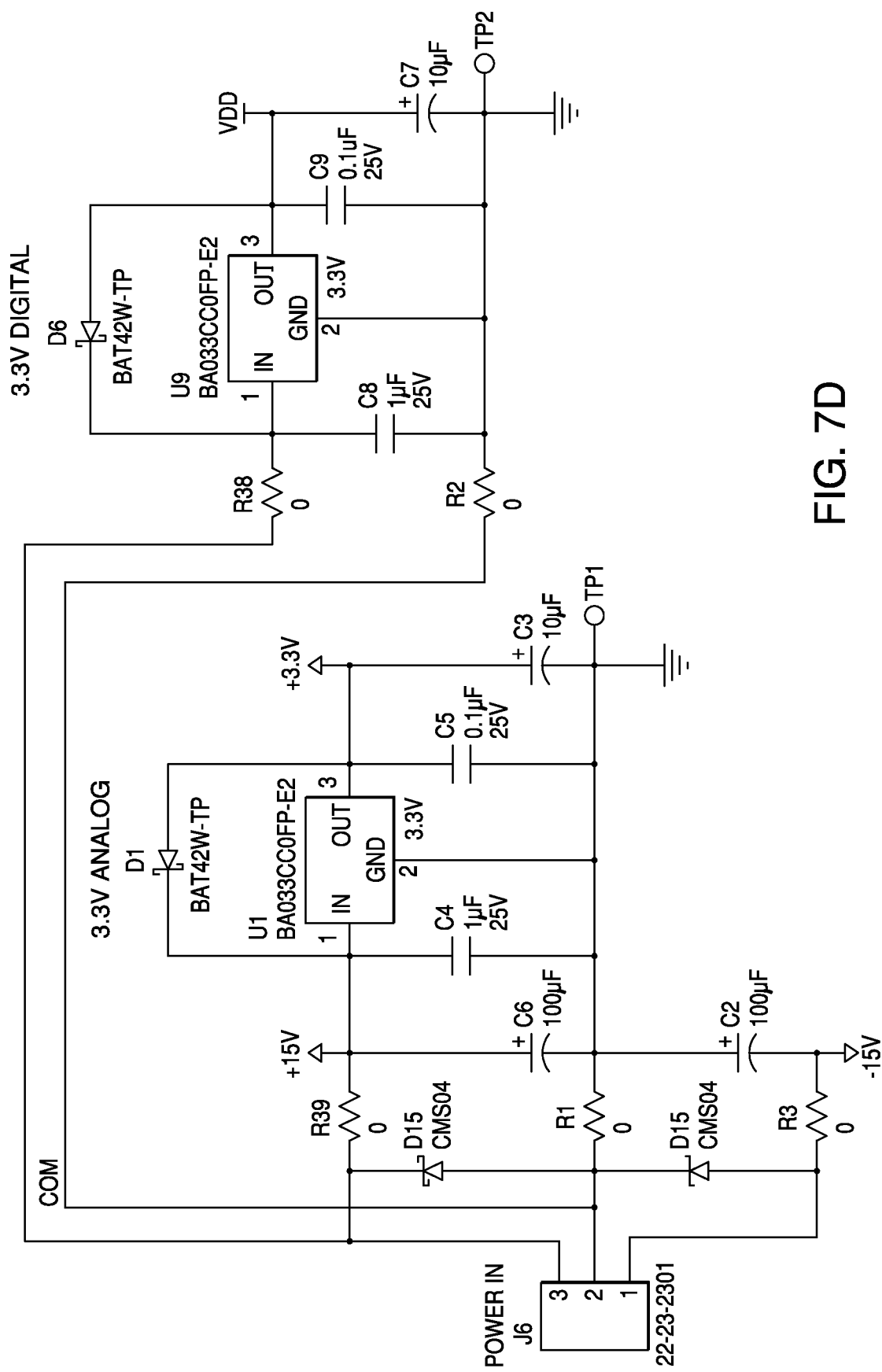

FIG. 7d is an example circuit of an analog and digital power supplies.

Figure 7E:
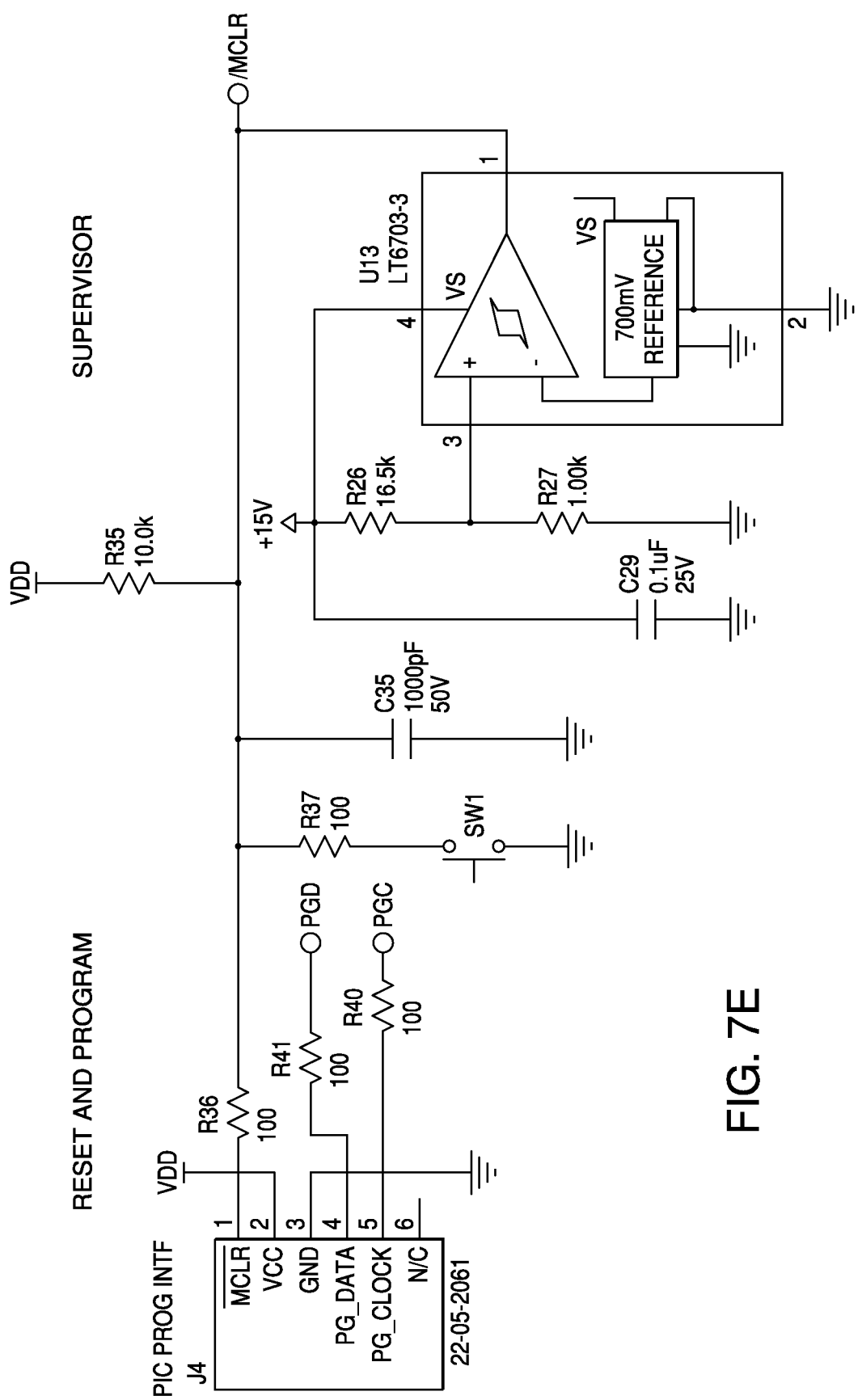

FIG. 7e is an example circuit of reset and program and supervisor circuitry.

Figure 7F:
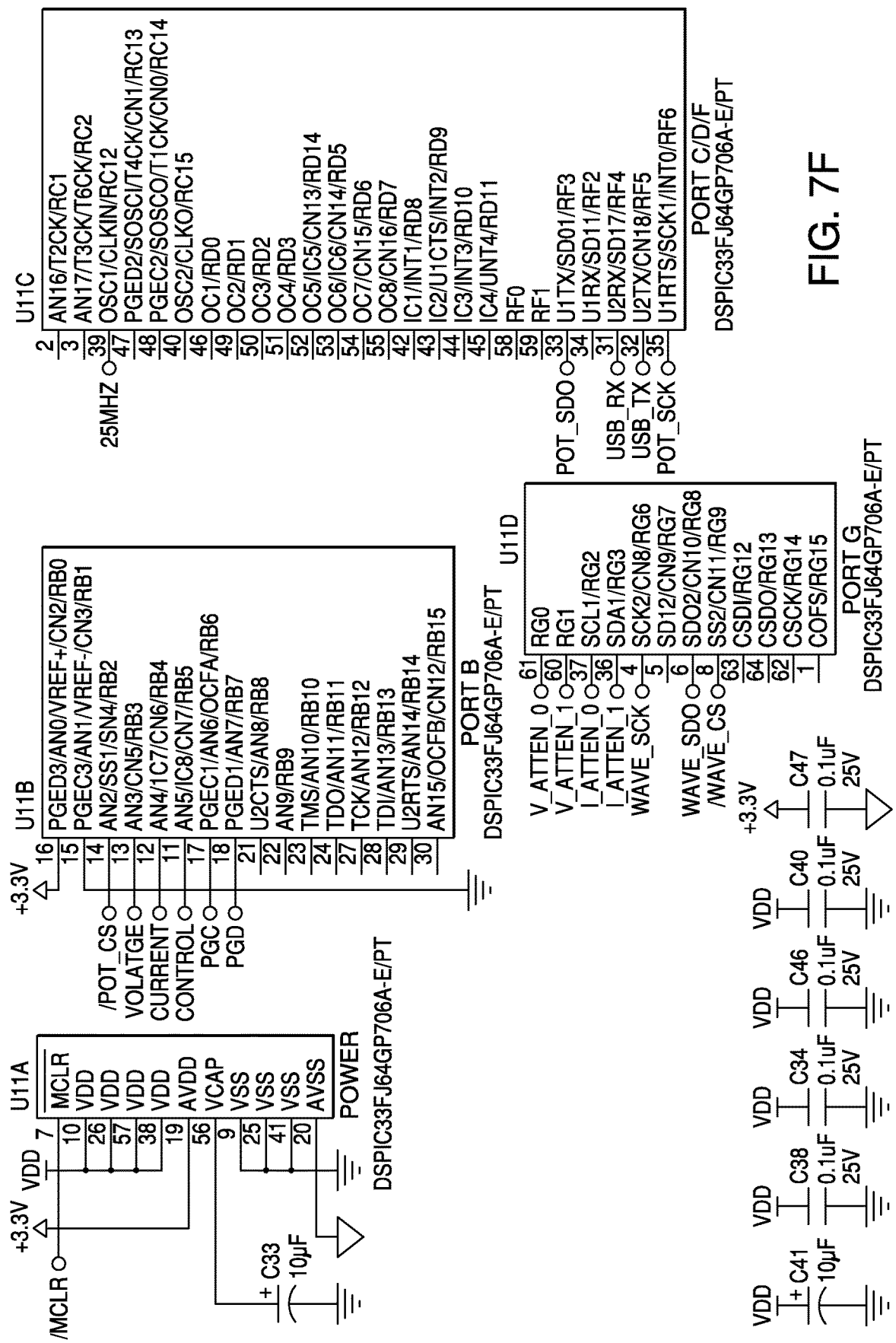

FIG. 7f is an example circuit arrangement of the processing circuitry 34.

Figure 7G:
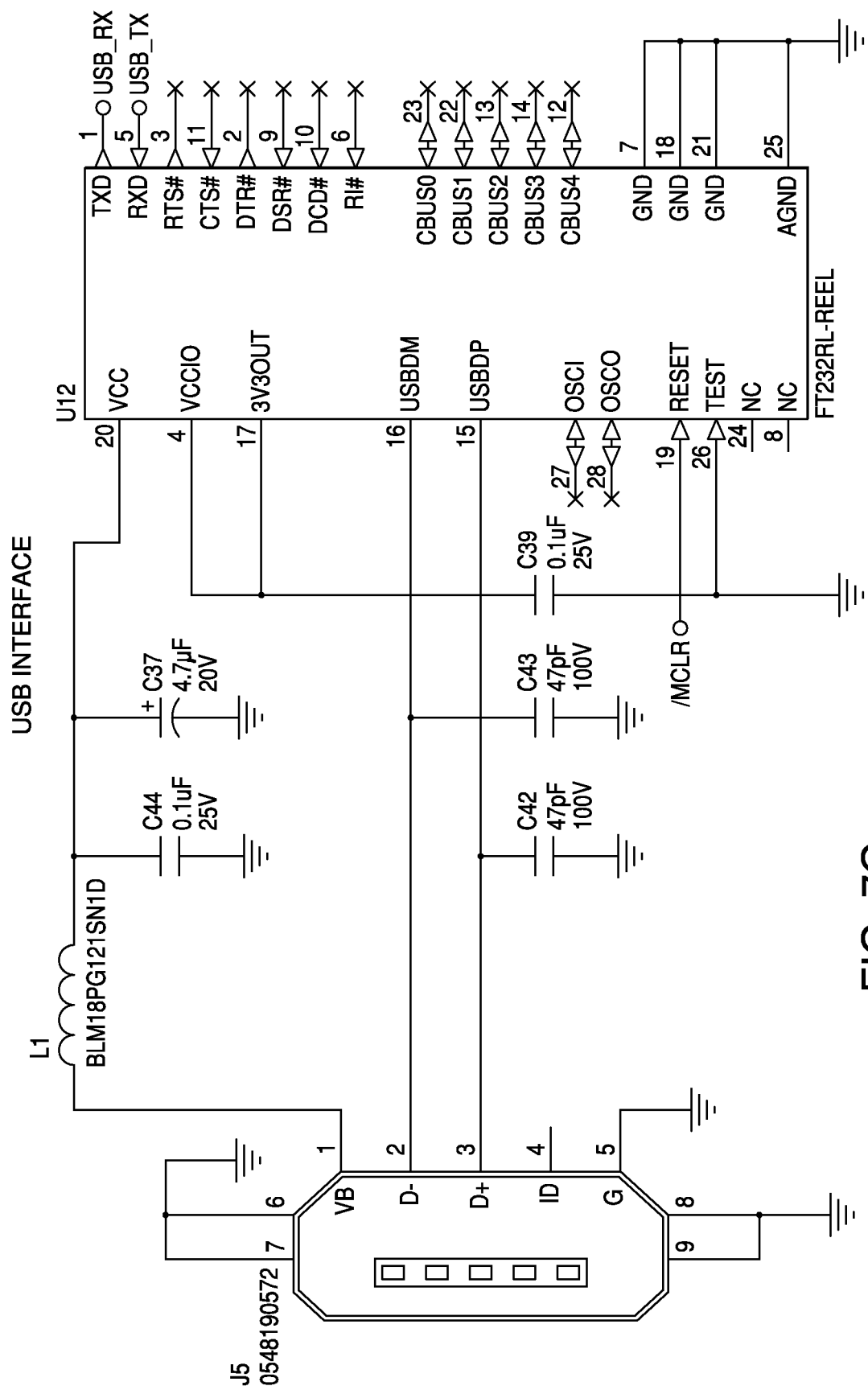

FIG. 7g is an example circuit of communication interface 36.

Figure 7H:
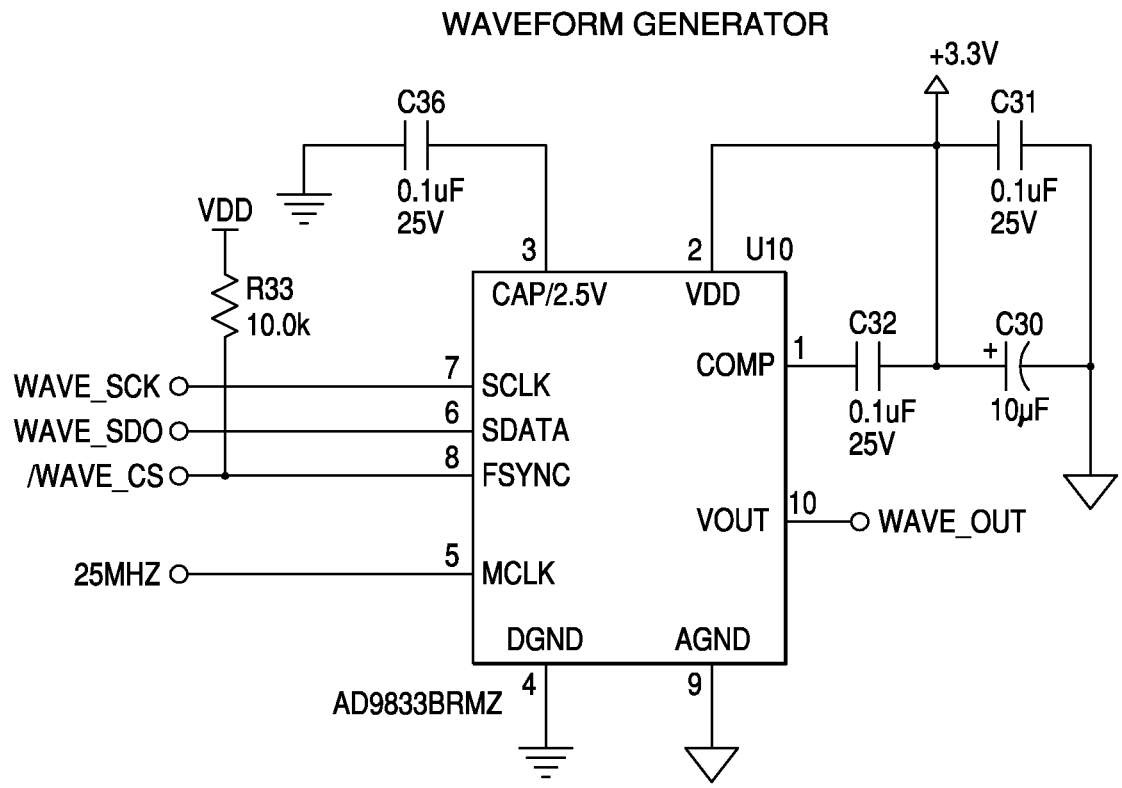

FIG. 7h is an example circuit of the programmable waveform generator 40.

Figure 7I:
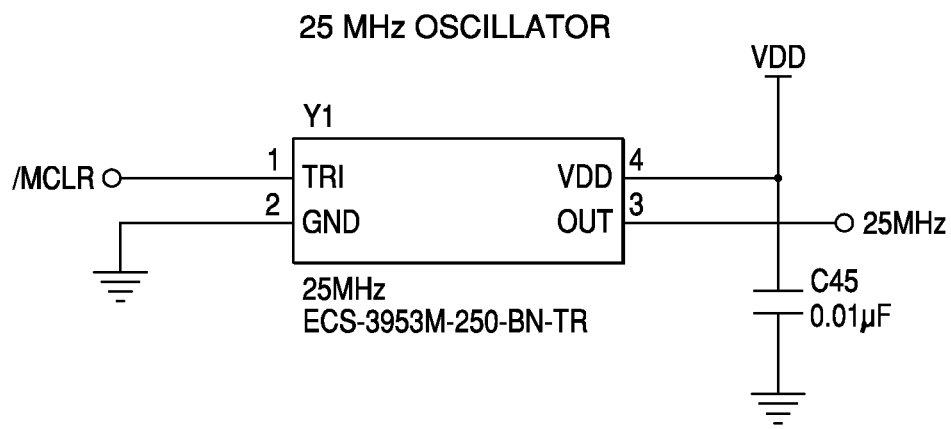

FIG. 7i is an example circuit of the clock 38.

In some embodiments, processing circuitry 34 measures the impedance of the transducer 14 as a function of frequency so the driving system 12 can lock to a desired (e.g., minimum) impedance of resonance of transducer 14. It is desired to provide accurate measurements of the impedance since the application of high power at the wrong frequency could destroy the transducer 14. In one embodiment, the impedance calculations are performed in real time to detect changes in the impedance, and if needed, power may be reduced before mechanical failure of the transducer 14 occurs. Details of calculating impedance of resonance of transducer 14 in accordance with one embodiment are described below.

The available data for computing the impedance comprises N samples of voltage waveform v[n] and current waveform i[n] outputted by input conditioning circuits 32 and taken simultaneously within a sample period T. Each waveform y[t] contains N samples of a sinusoid with known frequency $\omega_0 = 2\pi f_0$ but unknown amplitude A and phase $\phi$. The measurement process introduces noise and various nonlinearities into the waveform, however, the most significant source of error is a possible fixed offset $y_0$. This term expresses the offset voltages of the input amplifiers and analog-to-digital converters (ADCs) within processing circuitry 34, and which may vary slowly over time, but is essentially constant over the measurement interval. The waveform may then be expressed as $$y[n] = A\cos(\omega_0 T n - \phi) + y_0, \quad 0 \leq n < N.$$

Once the values of A, $\phi$, and $y_0$ are known for each waveform, the magnitude of the impedance may be calculated by the processing circuitry 34 by dividing the amplitude of the voltage waveform by the amplitude of the current waveform. The phase of the impedance, which is useful for characterizing the output power, is the difference between the two phase angles.

One example method for calculating A would be to subtract the mean value of y[n] first to cancel the offset and find the root mean square (RMS) value of y[n]. This simple approach only produces the correct result if the waveform contains an integer number of sample periods. The equivalent condition that $N\omega_0 T$ be an integer multiple of $2\pi$ is rarely possible, because T is fixed and $f_0$ must change in small steps.

Another method described below cancels these so-called windowing effects and computes the correct result for all frequencies in one embodiment. In particular, the waveform y[n] may be considered as the product of an infinite continuous signal with a finite sampling window:

$$y(t) = [A\cos(\omega_0 t - \phi) + y_0] \sum_{n=0}^{N-1} \delta(t - Tn).$$

The Fourier transform $Y(\omega)$ equals the convolution of the Fourier transforms of the two components:

$$Y(\omega) = [\pi\delta(\omega - \omega_0 T)Ae^{-j\phi} + \pi\delta(\omega + \omega_0 T)Ae^{j\phi} + 2\pi\delta(\omega)y_0] *$$

$$\left[ \frac{\sin\frac{N\omega}{2}}{\sin\frac{\omega}{2}} e^{-\frac{j(N-1)\omega}{2}} \right]$$

$$= \pi \frac{\sin\frac{N(\omega - \omega_0 T)}{2}}{\sin\frac{\omega - \omega_0 T}{2}} e^{-\frac{j(N-1)(\omega - \omega_0 T)}{2}} Ae^{-j\phi} +$$

$$\pi \frac{\sin\frac{N(\omega + \omega_0 T)}{2}}{\sin\frac{\omega + \omega_0 T}{2}} e^{-\frac{j(N-1)(\omega + \omega_0 T)}{2}} Ae^{j\phi} +$$

$$2\pi \frac{\sin\frac{N\omega}{2}}{\sin\frac{\omega}{2}} e^{-\frac{j(N-1)\omega}{2}} y_0.$$

Consider the value of $Y(\omega)$ at the normalized frequency $\omega_0 T$, taking the limit as the first sine terms approach zero:

$$Y(\omega_0 T) = \pi N A e^{-j\phi} + \pi \frac{\sin N\omega_0 T}{\sin \omega_0 T} e^{-j(N-1)\omega_0 T} A e^{j\phi} + 2\pi \frac{\sin \frac{N\omega_0 T}{2}}{\sin \frac{\omega_0 T}{2}} e^{-\frac{j(N-1)\omega_0 T}{2}} y_0.$$

If the waveform contains an integer number of sample periods, $N\omega_0 T$ becomes an integer multiple of $2\pi$ and the last two terms drop out, leaving $\pi N A e^{-j\phi}$ as the result. Thus, the last two terms account for the errors caused by arbitrary measurement times.

Suppose temporarily that $y_0=0$. Breaking the above equation into real and imaginary portions and simplifying, $$\begin{bmatrix} \mathrm{Re}\{Y(\omega_0 T)\} \\ \mathrm{Im}\{Y(\omega_0 T)\} \end{bmatrix} = \pi N \begin{bmatrix} 1+p & q \\ q & 1-p \end{bmatrix} \begin{bmatrix} \mathrm{Re}\{Ae^{-j\phi}\} \\ \mathrm{Im}\{Ae^{-j\phi}\} \end{bmatrix},$$

where $$p + jq = \frac{\sin N\omega_0 T}{N \sin \omega_0 T} e^{-j(N-1)\omega_0 T}.$$

The solution to the above system is $$\begin{bmatrix} \mathrm{Re}\{Ae^{-j\phi}\} \\ \mathrm{Im}\{Ae^{-j\phi}\} \end{bmatrix} = \frac{1}{\pi N(1-p^2-q^2)} \begin{bmatrix} 1-p & -q \\ -q & 1+p \end{bmatrix} \begin{bmatrix} \mathrm{Re}\{Y(\omega_0 T)\} \\ \mathrm{Im}\{Y(\omega_0 T)\} \end{bmatrix},$$

which permits the true value of $Ae^{-j\phi}$ to be extracted.

The process becomes more complex, but still tractable, if $y_0$ is a third unknown. First consider the value of $Y(\omega)$ at zero:

$$Y(0) = \pi \frac{\sin \frac{N\omega_0 T}{2}}{\sin \frac{\omega_0 T}{2}} e^{\frac{j(N-1)\omega_0 T}{2}} A e^{-j\phi} + \pi \frac{\sin \frac{N\omega_0 T}{2}}{\sin \frac{\omega_0 T}{2}} e^{-\frac{j(N-1)\omega_0 T}{2}} A e^{j\phi} + 2\pi N y_0.$$

Note that $Y(0)$ is real. Combining the equations for $Y(\omega_0 T)$ and $Y(0)$, $$\begin{bmatrix} \mathrm{Re}\{Y(\omega_0 T)\} \\ \mathrm{Im}\{Y(\omega_0 T)\} \\ Y(0) \end{bmatrix} = \pi N \begin{bmatrix} 1+p & q & r \\ q & 1-p & s \\ 2r & 2s & 1 \end{bmatrix} \begin{bmatrix} \mathrm{Re}\{Ae^{-j\phi}\} \\ \mathrm{Im}\{Ae^{-j\phi}\} \\ y_0 \end{bmatrix},$$

where p and q are as before and $$r + js = \frac{\sin \frac{N\omega_0 T}{2}}{N \sin \frac{\omega_0 T}{2}} e^{-\frac{j(N-1)\omega_0 T}{2}}.$$

Solving, $$\begin{bmatrix} \mathrm{Re}\{Ae^{-j\phi}\} \\ \mathrm{Im}\{Ae^{-j\phi}\} \\ y_0 \end{bmatrix} =$$

$$\frac{1}{\pi N d} \begin{bmatrix} 1-p-2s^2 & -q+2rs & pr+qs-r \\ -q+2rs & 1+p-2r^2 & -ps+qr-s \\ 2(pr+qs-r) & 2(-ps+qr-s) & 1-p^2-q^2 \end{bmatrix} \begin{bmatrix} \mathrm{Re}\{Y(\omega_0 T)\} \\ \mathrm{Im}\{Y(\omega_0 T)\} \\ Y(0) \end{bmatrix},$$

where $$d = 1 - p^2 - q^2 + 2pr^2 - 2ps^2 - 2r^2 - 2s^2 + 4qrs.$$

The digital auto acquisition board computes $Y(\omega_0 T)$ and $Y(0)$ from the measured waveform $y[n]$ in one embodiment using the definition of the Fourier transform:

$$Y(\omega_0 T) = \sum_{n=0}^{N-1} y[n] e^{-j\omega_0 Tn},$$

$$Y(0) = \sum_{n=0}^{N-1} y[n].$$

These calculations may be performed using fixed-point arithmetic for speed and all subsequent corrections use floating-point arithmetic to prevent rounding errors in one embodiment.

In the correction matrix shown previously, only five unique values are needed to compute the real and imaginary components of $Ae^{-j\phi}$. The value for the offset is not of great concern. The five correction terms may be computed offline for 1024 frequencies and stored in lookup tables on the microcontroller. The values could also be computed on the fly in real time.

The last step is to convert the real and imaginary components of $Ae^{-j\phi}$ into the desired magnitude and phase for each of the voltage and current of an individual driving signal. Accordingly, in one embodiment, the voltage representations of the voltage and current of the driving signals received by the input conditioning circuits 32 may be used (e.g., by dividing the voltage by the current) to determine the impedances of the transducer 14 resulting from the application of the driving signals to the transducer 14. In one embodiment, processing circuitry 34 implements the described signal processing to compute the magnitude and phase of the impedance in real time.

Experiments were performed to assess the functionality and performance of a prototype driving system using both discrete component models and an actual transducer to test the system. In particular, a number of discrete component models of the piezoelectric transducer were created to test various aspects of the system.

Figure 8A:
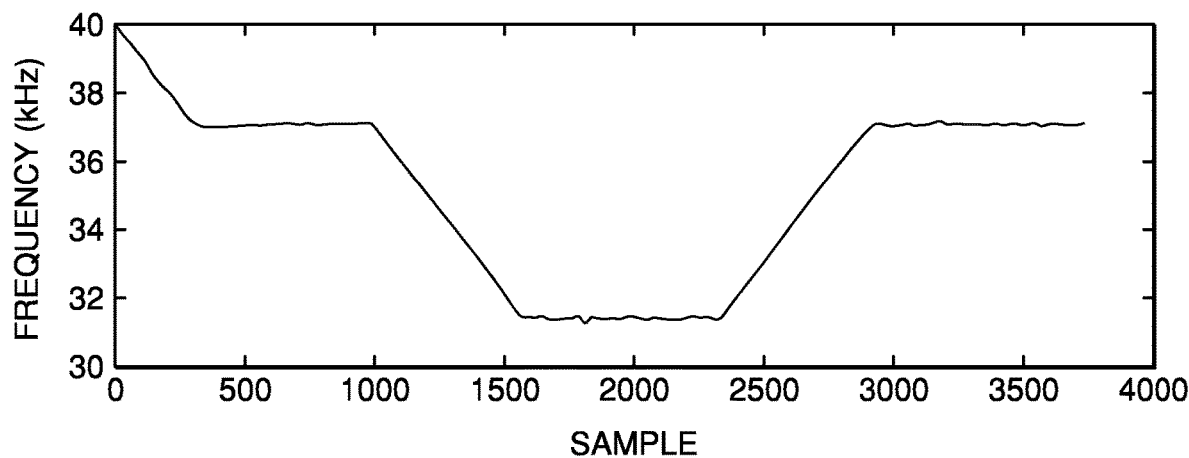
FIGS. 8*a* and 8*b* are respective transient plots of frequency and impedance as a function of time for a first discrete component model of a transducer.
Figure 8B:
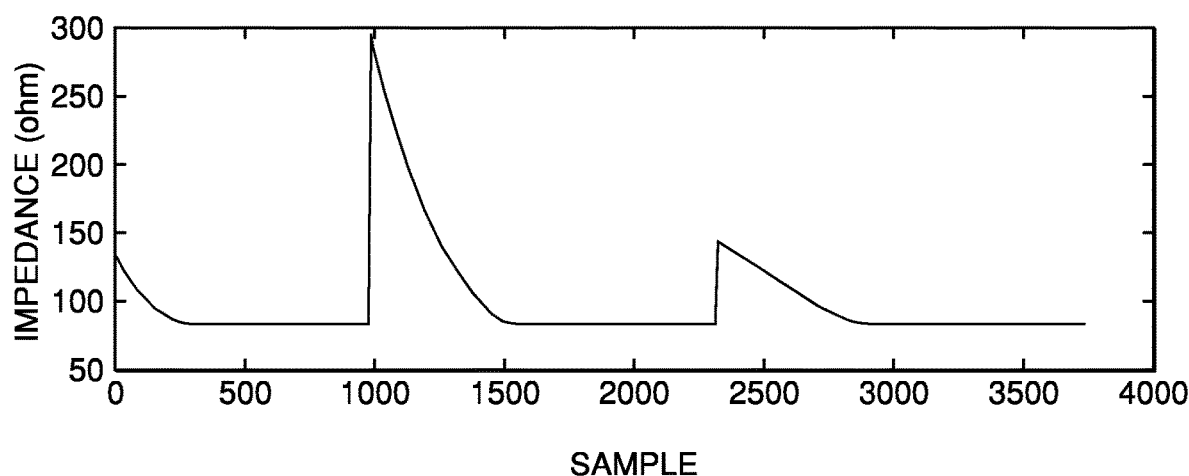

A first model contained an electrical switch that may be toggled between two resonance frequencies. FIGS. 8A and 8B are respective plots of frequency and impedance as a function of time (in samples). The switch was placed in position 1, then position 2, then position 1 again. The system successfully locks to the first resonance frequency, then searches for and locks to the new resonance frequency after the switch is flipped. At steady state, the frequency excursions are about 180 Hz peak-to-peak.

Figure 9:
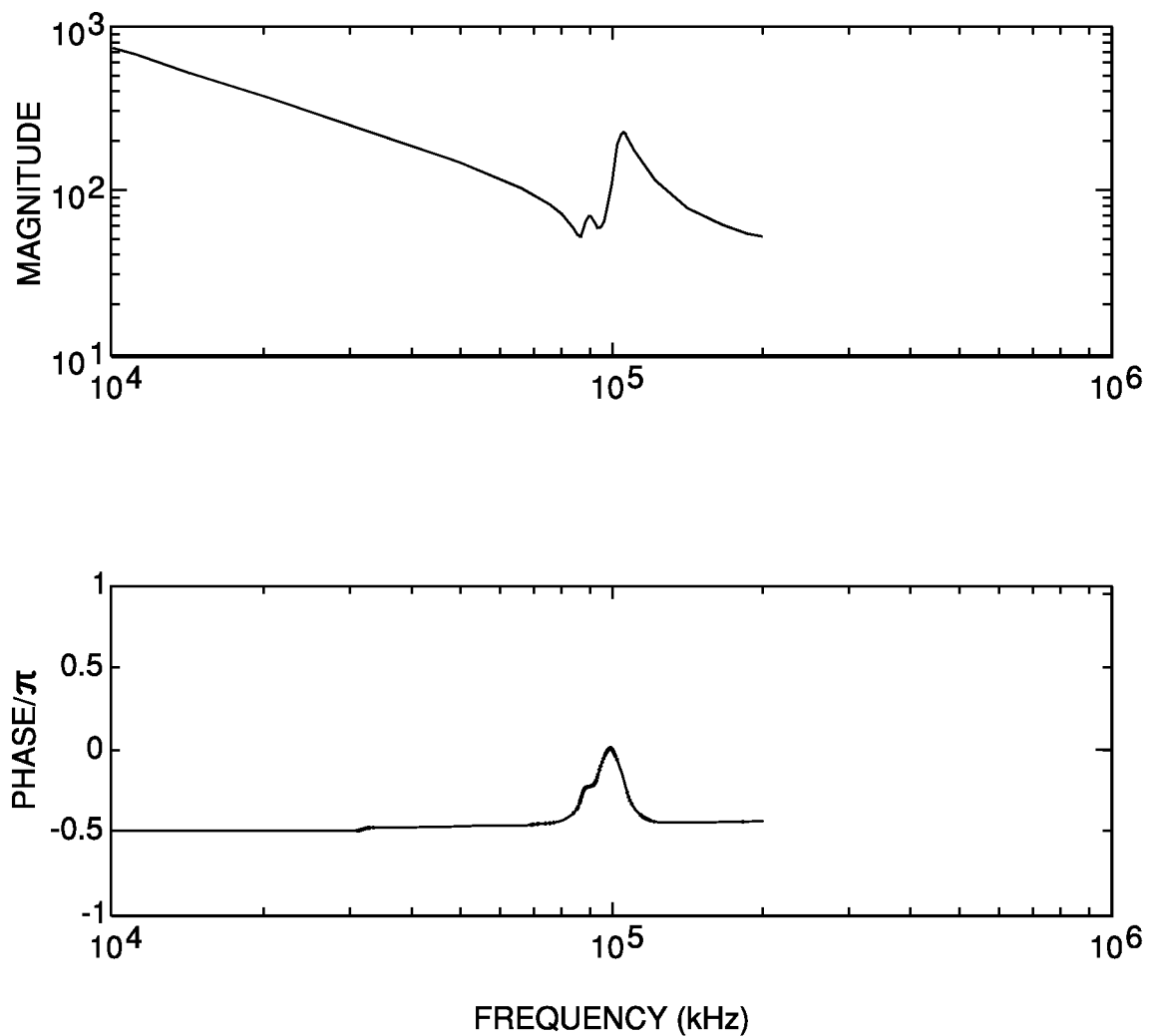
FIG. 9 is a plot of impedance versus frequency for a second discrete component model of a transducer.

Referring to FIG. 9, a second discrete model contained a spurious resonance mode immediately below the desired resonance frequency.

Figure 10:
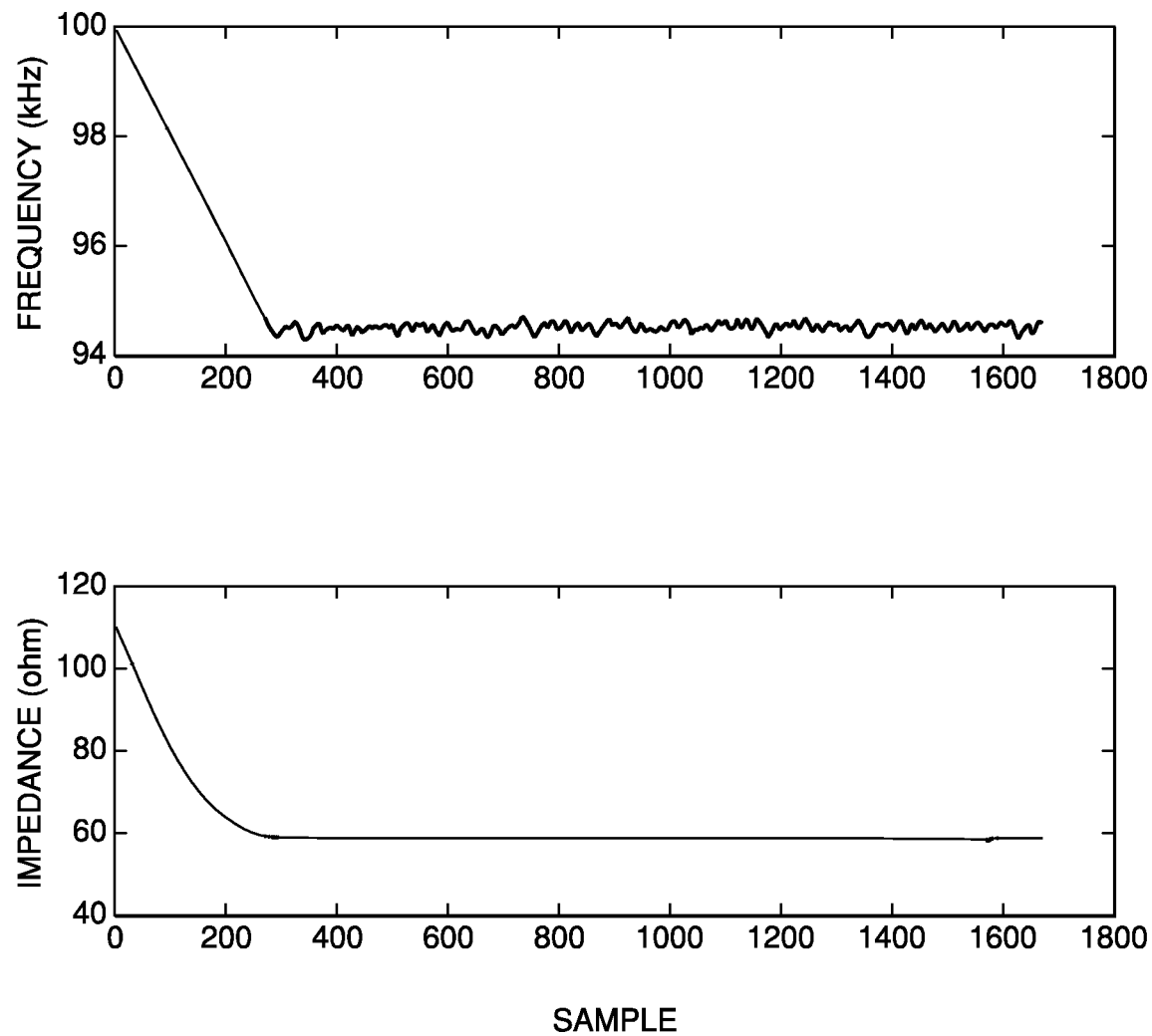
FIG. 10 is a transient plot of frequency and impedance as a function of time for the second discrete component model of the transducer.

Referring to FIG. 10, processing circuitry 34 was programmed to scan for resonances between 80-100 kHz, but only accept the highest resonance. FIG. 10 is a similar plot of the resulting transient behavior. The circuit locks to the desired mode at 94.2 kHz and ignores the spurious mode at 86.3 kHz by accepting the highest resonance and disregarding the lower resonance according to predefined criteria.

Figure 11:
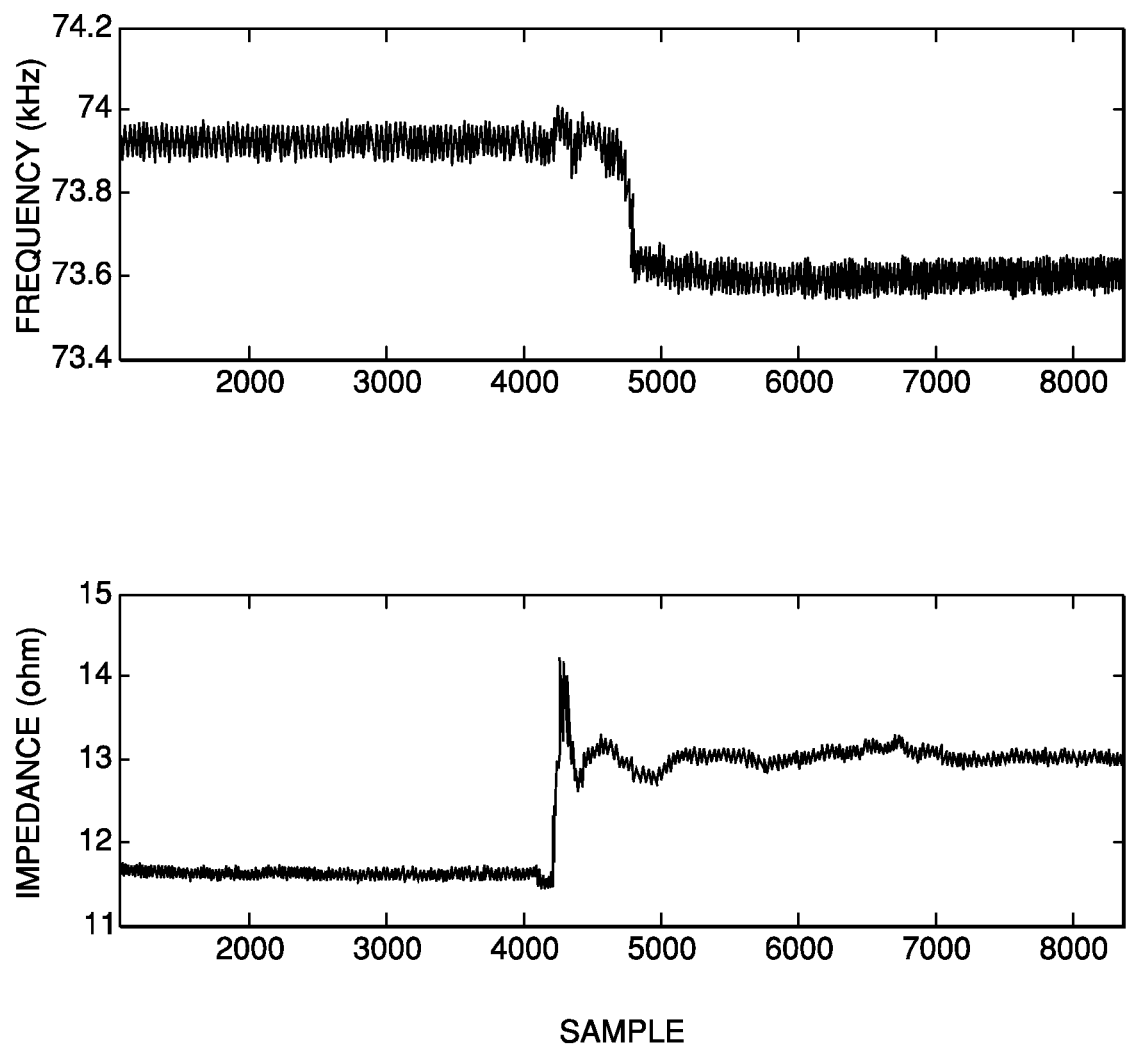
FIG. 11 is a transient plot of frequency and impedance as a function of time for an actual transducer.

Using a similar algorithm with an actual transducer produced the behavior in FIG. 11. The transducer was placed around a pipe, which was filled with water midway through the data collection. The system was able to lock to the new resonance frequency.

Maintaining the drive frequency of the piezoelectric transducer at the proper resonance frequency is desired since driving the transducer at only 0.02% off the desired frequency is highly inefficient in terms of energy transfer, and may even destroy the transducer. As described above, at least some embodiments of the disclosure are directed towards digital tracking systems which can effectively lock to a resonance frequency. These systems have been found to be a practical configuration for oil sonication applications where piezoelectric transducers can have undesired resonance modes very near to the proper frequency. Some analog tracking systems are not able to isolate one of several nearby modes and lock exactly to this mode. In contrast, digital tracking systems may implement decision logic necessary to lock to the desired frequency and reject undesired frequencies, for example using predefined criteria.

In general, the locking frequency and transducer impedance change as the medium properties change with fluid flow. Digital tracking systems described herein implement advanced algorithms to maintain maximum power transfer to the piezoelectric transducer. The system may also immediately reduce or cease the power in the event of abnormal circumstances such, as a sudden increase in impedance.

At least some digital tracking systems described herein have the ability to process voltage and current waveforms in real time. Signal processing techniques described herein may be used to remove "windowing" artifacts caused by sampling the waveforms for a brief amount of time which may otherwise disrupt the locking process. Some tracking and locking systems may also use impedance (admittance) locking discussed herein in combination with phase locking. In addition, use of digital systems according to some embodiments may implement appropriate control logic to diagnose and prevent problems.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended aspects appropriately interpreted in accordance with the doctrine of equivalents.

Further, aspects herein have been presented for guidance in construction and/or operation of illustrative embodiments of the disclosure. Applicant(s) hereof consider these described illustrative embodiments to also include, disclose and describe further inventive aspects in addition to those explicitly disclosed. For example, the additional inventive aspects may include less, more and/or alternative features than those described in the illustrative embodiments. In more specific examples, Applicants consider the disclosure to include, disclose and describe methods which include less, more and/or alternative steps than those methods explicitly disclosed as well as apparatus which includes less, more and/or alternative structure than the explicitly disclosed structure.

What is claimed is:

1. A transducer driving method comprising:
   using driving circuitry, providing a plurality of initial driving signals to a transducer, wherein each of the initial driving signals has a respective one of a plurality of different initial frequencies and the transducer has different initial impedances during the provision of the initial driving signals to the transducer;
   using processing circuitry, identifying one of the initial frequencies where the transducer has a reduced initial impedance compared with others of the initial impedances of the transducer resulting from the provision of others of the initial frequencies to the transducer;
   using the identified one of the initial frequencies, selecting a plurality of different additional frequencies using the processing circuitry;
   using the processing circuitry, controlling provision of a plurality of additional driving signals to the transducer, wherein each of the additional driving signals has one of the additional frequencies and the transducer has different subsequent impedances during the provision of the additional driving signals to the transducer;
   using the processing circuitry, identifying one of the additional frequencies where the transducer has a reduced subsequent impedance compared with others of the subsequent impedances of the transducer resulting from the provision of others of the additional frequencies to the transducer;
   using the processing circuitry, controlling provision of another driving signal having the one of the additional frequencies to the transducer after the identifying the one of the additional frequencies; and
   wherein the one of the additional frequencies of the another driving signal is a resonant frequency of the transducer.

2. The method of claim 1 wherein the additional and the another driving signals have increased amplitudes compared with the initial driving signals.

3. The method of claim 1 wherein the different initial frequencies are within a first frequency range, and the different additional frequencies are within a second frequency range which is different than the first frequency range.

4. The method of claim 3 wherein the second frequency range is smaller than the first frequency range.

5. The method of claim 4 wherein the second frequency range is centered about the one initial frequency.

6. The method of claim 1 wherein the identifying the one additional frequency comprises identifying as a result of the transducer having a minimum subsequent impedance during the provision of the additional driving signal having the one additional frequency.

7. The method of claim 6 further comprising, using the processing circuitry, determining that an amplitude of the minimum subsequent impedance is less than a threshold before the applying the another driving signal to the transducer.

8. The method of claim 1 further comprising:
   using the processing circuitry, identifying another of the additional frequencies where the transducer has another reduced subsequent impedance; and using the processing circuitry, determining not to provide the another of the additional frequencies to the transducer using criteria defined before the provision of the additional driving signals to the transducer.

9. The method of claim 1 further comprising generating an alarm indication regarding the transducer as a result of the provision of the initial driving signals to the transducer.

10. The method of claim 1 further comprising:
generating a plurality of digital samples of signals which are indicative of currents through the transducer and voltages across the transducer during the provision of the initial driving signals to the transducer; and
using the processing circuitry, calculating the initial impedances of the transducer using the digital samples.

11. The method of claim 1 wherein the providing the plurality of additional driving signals comprises providing as a result of the one initial frequency being within a predefined frequency range.

12. The method of claim 1 wherein the providing the plurality of additional driving signals comprises providing as a result of the reduced initial impedance of the transducer during the provision of one of the initial driving signals being less than a predefined threshold.

13. The method of claim 1 wherein the applying the another driving signal comprises applying the another driving signal to an element of the transducer having a halved cylindrical shape.

14. A transducer driving system comprising:
driving circuitry configured to provide a plurality of initial driving signals to a transducer, wherein each of the initial driving signals has a respective one of a plurality of different initial frequencies and the transducer has different initial impedances during the provision of the initial driving signals to the transducer; and
processing circuitry configured to:
identify one of the initial frequencies where the transducer has a reduced initial impedance compared with others of the initial impedances of the transducer resulting from the provision of others of the initial frequencies to the transducer;
use the identified one of the initial frequencies to select a plurality of different additional frequencies;
control provision of a plurality of additional driving signals to the transducer, wherein each of the additional driving signals has one of the additional frequencies and the transducer has different subsequent impedances during the provision of the additional driving signals to the transducer;
identify one of the additional frequencies where the transducer has a reduced subsequent impedance compared with others of the subsequent impedances of the transducer resulting from the provision of others of the additional frequencies to the transducer; and
control provision of another driving signal having the one of the additional frequencies to the transducer after the identifying the one of the additional frequencies; and
wherein the one of the additional frequencies of the another driving signal is a resonant frequency of the transducer.

15. The system of claim 14 wherein the processing circuitry is configured to process a plurality of digital samples of signals which are indicative of currents through the transducer and voltages across the transducer to determine the initial and subsequent impedances of the transducer.

16. The system of claim 14 wherein the another driving signal provides increased power to the transducer compared with the additional driving signals.

17. The system of claim 14 wherein the additional driving frequencies are incremented and decremented a plurality of amounts from the one initial frequency.

18. The system of claim 14 wherein the processing circuitry is configured to determine that another of the additional frequencies is unacceptable for use to drive the transducer although the another additional frequency results in the transducer having a minimum impedance.

19. The system of claim 14 wherein the transducer is a halved cylindrical transducer.

20. The system of claim 14 wherein the different initial frequencies are within a first frequency range, and the different additional frequencies are within a second frequency range which is different than the first frequency range.

21. The system of claim 20 wherein the second frequency range is smaller than the first frequency range.

22. The system of claim 14 wherein the processing circuitry is configured to identify the one additional frequency as a result of the transducer having a minimum subsequent impedance during the provision of the additional driving signal having the one additional frequency to the transducer.

23. The system of claim 22 wherein the processing circuitry is configured to determine that an amplitude of the minimum subsequent impedance is less than a threshold before controlling the provision of the another driving signal to the transducer.

24. The system of claim 14 wherein the processing circuitry is configured to identify another of the additional frequencies where the transducer has another reduced subsequent impedance, and to use criteria defined before the provision of the additional driving signals to the transducer to determine not to provide the another of the additional frequencies to the transducer.

25. The system of claim 14 further comprising a user interface, and wherein the processing circuitry is configured to control the user interface to generate an alarm indication regarding the transducer as a result of the provision of the initial driving signals to the transducer.

26. The system of claim 14 wherein the processing circuitry is configured to select the different additional frequencies as a result of the one initial frequency being within a predefined frequency range.

27. The system of claim 14 wherein the processing circuitry is configured to select the different additional frequencies as a result of the reduced initial impedance of the transducer being less than a predefined threshold.

28. The system of claim 19 wherein the transducer comprises two halves which have been separated from one another along a length axis of the transducer.

29. The system of claim 14 wherein the processing circuitry is configured to identify the one of the initial frequencies as a result of the transducer having a minimum initial impedance during the provision of the initial driving signals to the transducer.

30. The system of claim 14 wherein the processing circuitry is configured to identify the one of the additional frequencies as a result of the transducer having a minimum subsequent impedance during the provision of the additional driving signals to the transducer.

31. The system of claim 14 wherein the reduced subsequent impedance is less than the reduced initial impedance.

32. A transducer driving system comprising:

driving circuitry configured to provide a plurality of initial driving signals to a transducer, wherein each of the initial driving signals has a respective one of a plurality of different initial frequencies and the transducer has different initial impedances during the provision of the initial driving signals to the transducer; and processing circuitry configured to:
- identify one of the initial frequencies where the transducer has a reduced initial impedance compared with others of the initial impedances of the transducer resulting from the provision of others of the initial frequencies to the transducer;
- use the identified one of the initial frequencies to select a plurality of different additional frequencies;
- control provision of a plurality of additional driving signals to the transducer, wherein each of the additional driving signals has one of the additional frequencies and the transducer has different subsequent impedances during the provision of the additional driving signals to the transducer;
- identify one of the additional frequencies where the transducer has a reduced subsequent impedance compared with others of the subsequent impedances of the transducer resulting from the provision of others of the additional frequencies to the transducer; and
- control provision of another driving signal having the one of the additional frequencies to the transducer after the identifying the one of the additional frequencies;

wherein the different initial frequencies are within a first frequency range, and the different additional frequencies are within a second frequency range which is different than the first frequency range;

wherein the second frequency range is smaller than the first frequency range; and wherein the second frequency range is centered about the one initial frequency.

33. A transducer driving system comprising:

driving circuitry configured to provide a plurality of initial driving signals to a transducer, wherein each of the initial driving signals has a respective one of a plurality of different initial frequencies and the transducer has different initial impedances during the provision of the initial driving signals to the transducer; and processing circuitry configured to:
- identify one of the initial frequencies where the transducer has a reduced initial impedance compared with others of the initial impedances of the transducer resulting from the provision of others of the initial frequencies to the transducer;
- use the identified one of the initial frequencies to select a plurality of different additional frequencies;
- control provision of a plurality of additional driving signals to the transducer, wherein each of the additional driving signals has one of the additional frequencies and the transducer has different subsequent impedances during the provision of the additional driving signals to the transducer;
- identify one of the additional frequencies where the transducer has a reduced subsequent impedance compared with others of the subsequent impedances of the transducer resulting from the provision of others of the additional frequencies to the transducer; and
- control provision of another driving signal having the one of the additional frequencies to the transducer after the identifying the one of the additional frequencies; and wherein the transducer has a cylindrical shape, and the one of the additional frequencies of the another driving signal corresponds to a resonance of a length mode of the transducer.

34. A transducer driving system comprising:

driving circuitry configured to provide a plurality of initial driving signals to a transducer, wherein each of the initial driving signals has a respective one of a plurality of different initial frequencies and the transducer has different initial impedances during the provision of the initial driving signals to the transducer; and processing circuitry configured to:
- identify one of the initial frequencies where the transducer has a reduced initial impedance compared with others of the initial impedances of the transducer resulting from the provision of others of the initial frequencies to the transducer;
- use the identified one of the initial frequencies to select a plurality of different additional frequencies;
- control provision of a plurality of additional driving signals to the transducer, wherein each of the additional driving signals has one of the additional frequencies and the transducer has different subsequent impedances during the provision of the additional driving signals to the transducer;
- identify one of the additional frequencies where the transducer has a reduced subsequent impedance compared with others of the subsequent impedances of the transducer resulting from the provision of others of the additional frequencies to the transducer; and
- control provision of another driving signal having the one of the additional frequencies to the transducer after the identifying the one of the additional frequencies; and wherein the transducer has a cylindrical shape, and the one of the additional frequencies of the another driving signal corresponds to a resonance of a hoop mode of the transducer.

35. A transducer driving system comprising:

driving circuitry configured to provide a plurality of initial driving signals to a transducer, wherein each of the initial driving signals has a respective one of a plurality of different initial frequencies and the transducer has different initial impedances during the provision of the initial driving signals to the transducer; and processing circuitry configured to:
- identify one of the initial frequencies where the transducer has a reduced initial impedance compared with others of the initial impedances of the transducer resulting from the provision of others of the initial frequencies to the transducer;
- use the identified one of the initial frequencies to select a plurality of different additional frequencies;
- control provision of a plurality of additional driving signals to the transducer, wherein each of the additional driving signals has one of the additional frequencies and the transducer has different subsequent impedances during the provision of the additional driving signals to the transducer;
- identify one of the additional frequencies where the transducer has a reduced subsequent impedance compared with others of the subsequent impedances of the transducer resulting from the provision of others of the additional frequencies to the transducer; and control provision of another driving signal having the one of the additional frequencies to the transducer after the identifying the one of the additional frequencies; and wherein the transducer has a cylindrical shape, and the one of the additional frequencies of the another driving signal corresponds to a resonance of a thickness mode of the transducer.

\* \* \* \* \*

UNITED STATES PATENT AND TRADEMARK OFFICE
CERTIFICATE OF CORRECTION

PATENT NO. : 11,152,558 B2
APPLICATION NO. : 15/246073
DATED : October 19, 2021
INVENTOR(S) : Myjak et al.

It is certified that error appears in the above-identified patent and that said Letters Patent is hereby corrected as shown below:

On the Title Page

Item (56) References Cited, 2nd Column, 10th Line – Replace "Automaticaiiy" with --Automatically--

In the Specification

Column 1, Line 17 – Replace "Contract DE-AC0576RL01830" with --Contract DE-AC05-76RL01830--

Signed and Sealed this
Tenth Day of May, 2022

Katherine Kelly Vidal
*Director of the United States Patent and Trademark Office*